United States Patent [19]
Saito et al.

[11] Patent Number: 5,418,680
[45] Date of Patent: May 23, 1995

[54] APPARATUS FOR REPAIRING AN ELECTRICALLY SHORT-CIRCUITED SEMICONDUCTOR DEVICE

[75] Inventors: Keishi Saito; Tatsuyuki Aoike; Mitsuyuki Niwa; Toshimitsu Kariya; Yuzo Koda, all of Nagahama, Japan

[73] Assignee: Canon Kabushiki Kaisha, Tokyo, Japan

[21] Appl. No.: 155,655

[22] Filed: Nov. 22, 1993

Related U.S. Application Data

[62] Division of Ser. No. 755,439, Sep. 5, 1991, Pat. No. 5,281,541.

[30] Foreign Application Priority Data

Sep. 7, 1990 [JP] Japan ................................ 2-235851

[51] Int. Cl.⁶ ............................................ H05F 7/00
[52] U.S. Cl. .................................... 361/225; 361/212
[58] Field of Search ............... 361/212, 220, 225, 226, 361/227, 228, 229

[56] References Cited

U.S. PATENT DOCUMENTS

| | | | |
|---|---|---|---|
| 4,774,193 | 9/1988 | Juergens | 437/4 |
| 4,812,415 | 3/1989 | Yamazaki et al. | 437/2 |
| 4,916,304 | 4/1990 | Itabashi et al. | 250/211 R |
| 5,281,541 | 1/1994 | Saito et al. | 437/2 |

*Primary Examiner*—Jeffrey A. Gaffin
*Attorney, Agent, or Firm*—Fitzpatrick, Cella, Harper & Scinto

[57] ABSTRACT

An apparatus for repairing a defective semiconductor device having an electrically short-circuited portion, wherein the semiconductor device includes a semiconductor thin film and a conductive thin film disposed in the named order on a conductive surface of a substrate and in which the conductive thin film and the conductive surface of the substrate are electrically short-circuited at a pinhole occurring in the semiconductor thin film to form an electrically short-circuited portion so that the semiconductor device is defective. The apparatus includes a substrate holding unit for holding the substrate of the defective semiconductor device and an electrode arranged above the substrate holding unit so that, when the defective semiconductor is positioned on the substrate holding unit, there is a predetermined distance between the electrode and the conductive thin film of the defective semiconductor device, the electrode being capable of moving in relation to the substrate of the defective semiconductor device. The apparatus further includes a voltage applying unit for applying a desired voltage to the electrode, wherein discharge is caused between the electrode and the conductive thin film of the defective semiconductor device by applying a desired voltage to the electrode through the voltage applying means to thereby modify a region of the conductive thin film of the defective semiconductor device in electrical contact with the conductive surface of the substrate of the defective semiconductor device.

3 Claims, 12 Drawing Sheets

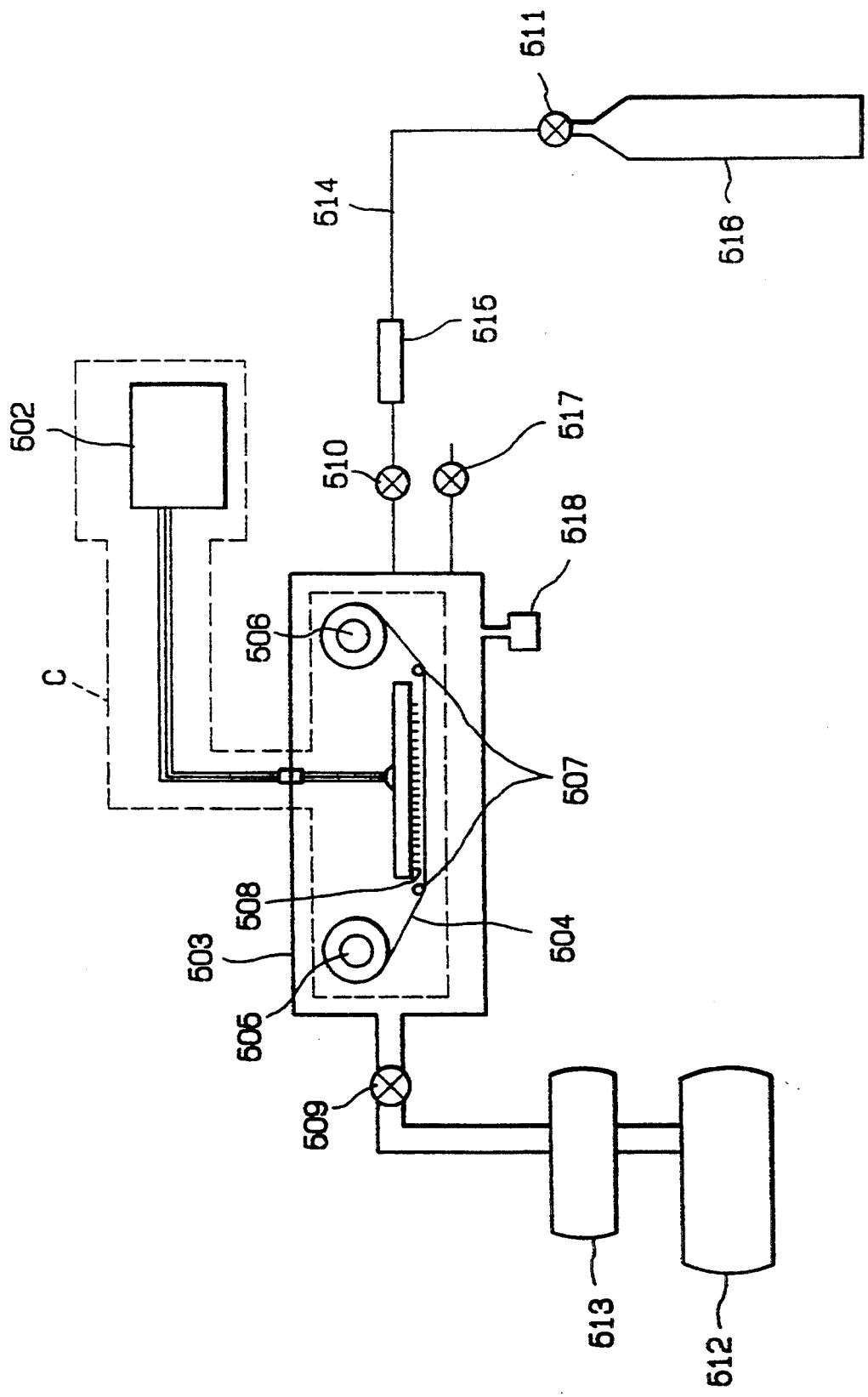

APPARATUS FOR REPAIRING AN ELECTRICALLY SHORT-CIRCUITED SEMICONDUCTOR DEVICE

This application is a division of application Ser. No. 07/755,439, filed Sep. 5, 1991, now U.S. Pat. No. 5,281,547.

BACKGROUND OF THE INVENTION

1. Field of the Invention

The present invention relates to a method for repairing an electrically short-circuited semiconductor device by insulating portions of the device which are short-circuited due to pin holes and the like, an apparatus suitable for practicing said method, and a process for producing a semiconductor device by utilizing said method.

2. Related Background Art

In recent years, various studies have been made on large area semiconductor devices such as solar cell, flat panel display, photosensor, electrophotographic photosensitive device, etc. In addition public attention has been focused on non-single crystal semiconductors such as amorphous silicon semiconductors to constitute those large area semiconductor devices mainly because of their reasonable production cost.

For instance, there is known a pin junction type amorphous silicon solar cell as an example of such non-single crystal semiconductor device. In this solar cell, photocarriers occur in its semiconductor layer, comprising an amorphous silicon semiconductor thin film when light is impinged in the solar cell. The photocarriers migrate to its transparent electrode comprising a transparent conductive thin film situated on the side through which light is impinged and also to its conductive substrate situated opposite the transparent electrode by the action of an internal electric field, to thereby provide a photoelectromotive force.

The conductive thin film serving as the transparent electrode and the semiconductor thin film serving as the photosensitive semiconductor layer may be properly formed in a vacuum chamber in accordance with a plasma CVD method, a photo CVD method, a thermal CVD method, a vacuum evaporation method, or a sputtering method.

In the preparation of such amorphous silicon solar cell, due regard should be made to the problem relating to a short circuit which is often caused between the transparent electrode and the conductive substrate due to pinholes occurring at part of the semiconductor layer.

There are various causes for such pinholes to occur. For instance, in one case, since the transparent electrode is usually of some hundreds of angstrom in thickness and the semiconductor layer is usually of about 0.005 to some tens of um, minute dust particles (some micronmeter to some tens micronmeter in size) are deposited on the surface of the conductive substrate or they are deposited on or contaminated into the semiconductor layer during film formation to cause a removal for the conductive substrate or/and the semiconductor layer, whereby such pinholes occur at the semiconductor layer.

In other case, such pinholes occur when part of the semiconductor layer is removed due to its internal stress or its insufficient adhesion with the transparent electrode to furnish the conductive substrate with a region not having a desired semiconductor layer. In this case, the transparent electrode situated on the side through which light is impinged and the conductive substrate situated opposite said electrode are connected with each other through said region to be in an electrically short-circuited state. This results in significantly degrading of the characteristics required for a semiconductor device.

The occurrence of pinholes causing a short circuit is a serious problem particularly in the case of a large area semiconductor device such as solar cell, flat panel display, photosensor, electrophotographic photosensitive device, etc. In any case, it is extremely difficult to obtain a large area semiconductor device completely free of a short-circuited state region even under a clean environment substantially free of minute dust.

In order to solve the above problem relating to occurrence of pinholes causing a short circuit, Japanese Patent Publication 62(1987)-53958 (hereinafter referred to as Literature 1) proposes a method of making the inside of each of the pinholes occurring at the thin film semiconductor layer of a photosemiconductor to be in an electrically insulating state by perforating pinholes at its electrode layer and communicating the pinholes of the thin film semiconductor layer with the pinholes of the electrode layer. Likewise, Japanese Patent Publication No. 62(1987)-59901 (hereinafter referred to as Literature 2) proposes a method of reclaiming pinholes occurring at the thin film semiconductor layer of a semiconductor device by fusing the peripheries of the pinholes with radiation of energy beam.

FIGS. 10(A) and 10(B) are schematic views respectively for explaining the method according to Literature 1.

In FIGS. 10(A) and 10(B), numeral reference 1 stands for a translucent substrate, numeral reference 2 stands for a translucent electrode layer, numeral reference 3 stands for a semiconductor layer comprising a thin semiconductor film, numeral reference 4 stands for a back electrode layer, numeral reference 5 stands for a pinhole in a short-circuited state, numeral reference 6 stands for a pinhole provided at the back electrode layer, numeral reference 7 stands for laser beam, and numeral reference 8 stands for laser beam.

The method according to Literature 1 is to be explained with reference to FIGS. 10(A) and 10(B). That is, after a plurality of semiconductor devices have been prepared, semiconductor devices defective due to a short circuit are sorted out. As for each of those defective semiconductor devices, beam plane-scanning is performed while irradiating laser beam 7 through the other principal face of the translucent substrate 1 as shown in FIG. 10(A). When a short circuit current for the semiconductor device is measured at the time of performing the beam plane-scanning, a short circuit current does not flow when the laser beam 7 is irradiated to the portion where a pinhole 5 in a short-circuited state is present, and on the other hand, upon irradiating the laser beam 7 to the other portion where such short-circuited state is not present, a hole-electron pair is caused and migrates in the semiconductor layer 3, whereby a short circuit current flows. In view of this, the position where a pinhole 5 is present can be found for the semiconductor device by performing plane-scanning using the laser beam 7.

As for the portion of the semiconductor layer where a pinehole 5 is present, laser beam outputted from YAG pulse laser of $5 \times 10^6$ W/cm$^2$ in peak outputting power is radiated through the back electrode layer 4 in the way as shown by an arrow 8 to thereby remove a short-circuited state region comprising the constituent of the back electrode layer 4 which is extended to the inside of the pinhole 5. Particularly, as shown in FIG. 10(B), a pinhole 6 is made at the back electrode layer 4 formed on the semiconductor layer 3 having the pinhole 5 occurring therethrough at the time of the formation thereof such that it is coaxially in communication with the pinhole 5, whereby the inside of the pinhole 5 and that of the pinhole 6 are made to be in an electrically insulating state.

FIGS. 10(C), 10(D) and 10(E) are schematic views for explaining the method according to Literature 2.

In FIGS. 10(C), 10(D) and 10(E), numeral reference 1 stands for a translucent substrate, numeral reference 2 stands for a translucent electrode layer, numeral reference 3 stands for a semiconductor layer comprising a thin semiconductor film, numeral reference 4 stands for a back electrode layer, numeral reference 5 stands for a pinhole in a short-circuited state, numeral reference 7 stands for laser beam, and numeral reference 9 stands for a photosensor.

The method according to Literature 2 is to be explained with reference to FIGS. 10(C) through 10(E).

That is, a translucent electrode 2 is formed on a translucent substrate 1 and then, a thin film semiconductor layer 3 is formed on the translucent electrode 2. As for the device thus obtained, it is examined whether or not the semiconductor layer 3 is accompanied with a pinhole 5, by plane-scanning is performed for the semiconductor layer 3 while irradiating laser beam 7 outputted from an Ar gas laser of an extremely low Outputting power through the rear side of the semiconductor layer 3 and moving a photosensor 9 arranged on the side of the translucent substrate 1 and opposite the Ar gas laser in synchronism with the scanning of the laser beam 7 in the way as shown in FIG. 10(C), to thereby examine whether or not the semiconductor layer 3 is accompanied with a pinhole 5. In this case, if such pinhole 5 is not present at the portion of the semiconductor layer 3 where the laser beam 7 is irradiated, the laser beam 7 is absorbed by the semiconductor 3 and does not reach the photosensor 9. On the other hand, if such pinhole 5 is present at the portion of the semiconductor layer 3 where the laser beam 7 is irradiated, the laser beam 7 reaches the photosensor 9, and from a signal outputted from the photosensor 9 at that time, the position where the pinhole 5 is present is detected.

When the presence of the pinhole 5 is optically detected as above described, laser beam of about 2 to 3 W/cm$^2$ in power outputted from, for example, an Ar gas laser of 514.5 nm in oscillating wavelength instead of the laser beam 7 is irradiated to the portion where the pinhole 5 is present to thereby fuse the peripheries of the pinhole 5 with respect to the semiconductor layer 3, whereby the pinhole 5 is filled up with the constituent of the semiconductor layer 3 in such a state as shown in FIG. 10(D). The filled portion of the semiconductor layer 3 exhibits a fused state at the beginning but it is sooner or later cooled, wherein the constituent of the filled portion is changed from amorphous state to polycrystalline state or the like and the junction state is eventually broken. Thus, the filled portion finally becomes to function substantially as an insulator.

Finally, as shown in FIG. 10(E), a 2000 to 10000 thick aluminum layer serving as a back electrode 4 is laminated on the semiconductor layer 3 having the above filled portion by a vacuum evaporation technique.

The above mentioned two methods are effective in order to solve the foregoing problems relating to short circuit caused due to pinholes occurring at the semiconductor layer to a certain extent, but there still exist such problems as will be mentioned below, which are necessary to be solved.

In the case of the method according to Literature 1, there is a problem that it takes a long period of time in order to detect a number of pinholes being present at the semiconductor layer of a large area by way of the laser beam scanning process.

There is also other problem for the method according to Literature 1 that, in this method, as apparent from FIG. 10(B), the pinhole 6 is left as it is in any case, however, such pinhole must be filled up in practice. That is, in the case of a semiconductor device having such a configuration as shown in FIG. 10(B) in which the pinhole 6 is left without being filled up, water, alkaline metal, or the like are apt to enter therethrough upon use, and once water or/and alkaline metal, etc. have entered thereinto, the semiconductor device will be deteriorated shortly. However, in order to fill up such pinhole as shown in FIG. 10(B), not only a specific technique is required but also it takes time, and because of this, the resulting product becomes unavoidably costly.

Likewise, there are some problems also for the method according to Literature 2. That is, in the case of the method according to Literature 2, as apparent from what shown in FIG. 10(D), the pinhole 6 is filled up by fusing the peripheries thereof, but this process is performed prior to forming the back electrode layer 4, and because of this, a pinhole which will be caused at the time of forming the back electrode layer on the semiconductor layer 3 having the filled portion is unavoidably left without being filled up. In addition to this, since the fill up of the pinhole 5 is performed through the laser beam-irradiating process which takes time while exposing the semiconductor layer 3 to environmental atmosphere, the quality of the semiconductor 3 is apt to deteriorate during the filling up process.

There is a still further problem for the method according to Literature 2 in that it takes a long period of time in order to detect a number of pinholes being present at the semiconductor layer of a large area by way of the laser beam scanning process and it is extremely difficult to fill up all such numerous pinholes uniformly by way of the laser beam fusing process.

In view of the above, in the case of the method according to Literature 2, if a desirable semiconductor device should be obtained, it will be costly.

SUMMARY OF THE INVENTION

A principal object of the present invention is to eliminate the foregoing problems in the prior art and to provide an improved method which enables to efficiently repair a short-circuited portion of a semiconductor device within a short period of time without performing such detecting process as in the prior art.

Other object of the present invention is to provide an apparatus suitable for practicing said improved method.

A further object of the present invention is to provide a process for producing an improved semiconductor device utilizing said improved method.

A still further object of the present invention is to provide an improved method for repairing a defective semiconductor device having an electrically short-circuited portion, comprising a semiconductor thin film and a transparent and conductive thin film being disposed in this order on a surface of a conductive substrate in which said transparent and conductive thin film and said conductive substrate are electrically short-circuited due to pinholes occurring at part of said semiconductor thin film, to form a desirable semiconductor device free of such short-circuited portion which functions as originally desired for the semiconductor device.

A still further object of the present invention is to provide a method which enables to efficiently repair a short-circuited portion of the constituent semiconductor member of a photovoltaic element within a short period of time without performing such detecting process as in the prior art to obtain a desirable photovoltaic element which is markedly improved with respect to short circuit current and open-circuit voltage and which stably provides a desirable photoelectric conversion efficiency without being deteriorated even upon repeated use for a long period of time.

The present invention effectively attains the above objects and it includes a method for repairing a defective semiconductor device to result in a desirable semiconductor device, an apparatus suitable for practicing said method and a process for producing a semiconductor device utilizing said method.

The method for repairing a defective semiconductor device according to the present invention is of the constitution which will be under described.

That is, a method for repairing a defective semiconductor device having an electrically short-circuited portion which comprises a semiconductor thin film and a conductive thin film being disposed in this order on a conductive surface of a substrate in which said conductive thin film and said conductive surface of substrate are electrically short-circuited due to pinholes occurring at part of said semiconductor thin film. A desired voltage is applied through a probe arranged over said electrically short-circuited portion while leaving a predetermined distance between said probe and said conductive thin film to cause discharge between said semiconductor device and said probe, whereby a region of said conductive thin film in electrical contact with the surface of said conductive surface of substrate is modified to establish an electrically noncontacted state between said conductive thin film and said conductive surface.

The apparatus suitable for practicing the above method according to the present invention is of the constitution which will be described below.

That is, an apparatus for repairing a defective semiconductor device having an electrically short-circuited portion which comprises a semiconductor thin film and a conductive thin film being disposed in this order on a conductive surface of a substrate in which said conductive thin film and said conductive substrate are electrically short-circuited due to pinholes occurring at part of said semiconductor thin film, said apparatus comprises:

a substrate holding means on which said substrate is to be positioned;

a probe being arranged over said semiconductor device positioned through its substrate on said substrate holding means while leaving a predetermined distance between said probe and said conductive thin film of the semiconductor device, said probe being capable of moving in relation to said substrate of the semiconductor device; and a voltage applying means for applying a desired voltage between said prove and said conductive surface of substrate; wherein discharge is caused between said probe and said conductive thin film by applying a desired voltage between said prove and said conductive surface of substrate through said voltage applying means to thereby modify a region of said conductive thin film in electrical contact with the surface of said conductive surface of substrate, whereby establishing an electrically noncontacted state between said conductive thin film of the semiconductor device and said conductive surface of substrate.

The process for producing a semiconductor device according to the present invention is of the constitution which will be described below.

That is, a process for producing a semiconductor device which comprises the steps of:

(a) positioning a substrate having a conductive surface on a substrate holding means in a deposition chamber;

(b) forming a semiconductor thin film and a conductive thin film in this order on said conductive surface of the substrate to prepare a semiconductor device;

(c) applying a desired voltage through a probe arranged over said semiconductor device while leaving a predetermined distance between said probe and said conductive thin film of the semiconductor device to cause discharge between said semiconductor device and said probe, whereby a region of said conductive thin film in electrical contact with the surface of said conductive surface of substrate is modified to establish an electrically noncontacted state between said conductive thin film and said conductive surface.

In the present invention, the probe is desired to continuously move over the semiconductor device while maintaining a predetermined distance between the probe and the conductive thin film of the semiconductor device upon causing discharge to fuse a portion of the conductive thin film in order to establish the foregoing electrically noncontacted state.

In a preferred embodiment, the process of establishing the foregoing electrically noncontacted state is performed by moving the probe in a predetermined direction over the semiconductor device while maintaining a predetermined distance between the probe and the conductive thin film of the semiconductor device and at the same time, intermittently moving the conductive substrate of the semiconductor device in a direction rectangular, or perpendicular to said predetermined direction with respect to the probe.

In the case of repairing a large area semiconductor device in the present invention, it is possible to arrange a plurality of probes at an equal interval over the semiconductor device while leaving a predetermined distance between each of the probes and the conductive thin film and move the semiconductor device to be repaired in a lengthwise direction of said plurality of probes.

As for the process of establishing the foregoing electrically noncontacted state, it is desired to be performed in a predetermined gaseous atmosphere. For instance, in a preferred embodiment, it is performed in a substantially enclosed vessel capable of vacuuming its inside containing one or more probes and a substrate holding means while supplying an appropriate gas such as clean air or other gas containing oxygen atoms or nitrogen atoms thereinto.

According to the present invention, a desirable semiconductor device satisfactory in the semiconductor characteristics required therefor can be efficiently produced with an improved yield.

BRIEF DESCRIPTION OF THE DRAWINGS

FIG. 5 is a schematic diagram of an apparatus suitable for practicing a second embodiment of the method for repairing a defective semiconductor device, according to the present invention.

DETAILED DESCRIPTION OF THE PREFERRED EMBODIMENTS

The semiconductor device which can be repaired in accordance with the repairing method of the present invention can include solar cells, flat panel displays, photosensors, electrophotographic photosensitive members, electron emission elements, luminescent elements, etc.

The repairing method of the present invention is particularly effective in repairing defective solar cells among others.

In view of this, an explanation is to be made with respect to the case of repairing a defective solar cell by the repairing method of the present invention.

Figure 1:
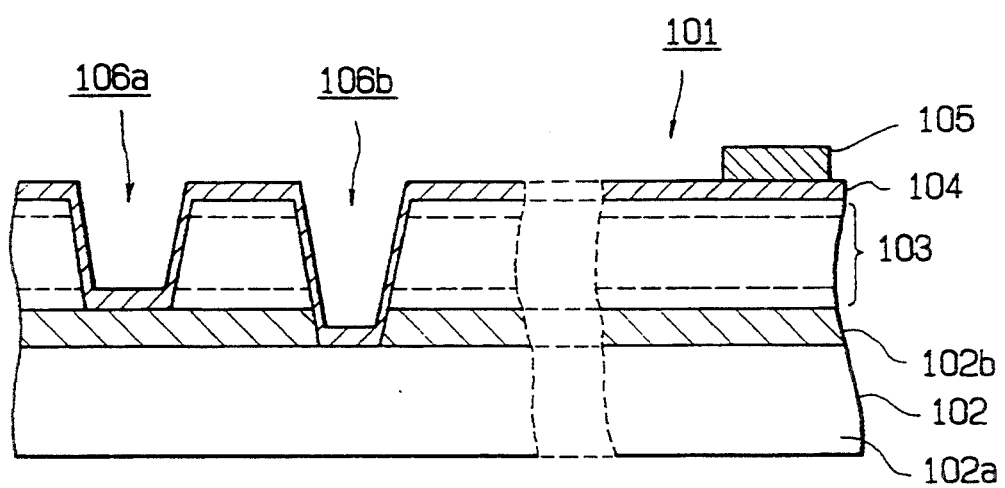
FIG. 1 is a schematic cross section view for explaining a defective semiconductor device having a short-circuited portion caused due to a pinhole.

Shown in FIG. 1 is a schematic cross section view of an example of such defective solar cell.

In FIG. 1, numeral reference 101 stands for the entire of a so-called single cell type solar cell which is of the constitution comprising a single cell with a pin junction being disposed between a conductive substrate and a transparent conductive thin film and which is short-circuited. Numeral reference 102 stands for a conductive substrate comprising a conductive thin film 102b being laminated on a conductive or insulating base member 102a. Numeral reference 103 stands for a photoelectric conversion layer comprising a pin junction semiconductor layer which is disposed on the conductive thin film 102b of the conductive substrate 102. Numeral reference 104 stands for a conductive thin film being laminated on the photoelectric conversion layer 103. Numeral reference 105 stands for a collecting electrode being disposed on the conductive thin film 104.

In the case where the solar cell 101 is of the type that light is impinged from the side of the conductive thin film 104, the conductive thin film 104 is made to be a transparent and conductive thin film composed of a transparent and conductive material, and at least either the base member 102a or the conductive thin film 102b is composed of an opaque material.

In the case where the solar cell 101 is of the type that light is impinged from the conductive substrate 102, the base member 102a is composed of a translucent material and the conductive thin film 102b is composed of a transparent and conductive material. As for the transparent and conductive thin film 104 in this case, it should be changed to be an opaque and conductive thin film.

Each of numeral references 106a and 106b stands for a pinhole occurring at the pin junction semiconductor layer (photoelectric conversion layer) 103, wherein 106a indicates a pinhole caused due to removal occurring at the pin junction semiconductor layer 103, and 106b indicates a pinhole caused due to removal occurred at the transparent conductive thin film 104 and the pin junction semiconductor layer 103.

In any of these two cases, there is present a short-circuited portion between the transparent conductive thin film 104 and the conductive substrate 102, and because of this, the solar cell is defective since it is in a short-circuited state and can not generate a photoelectromotive force as desired.

Other than the above, the repairing method of the present invention can be applied in repairing other short-circuited solar cells having a plurality of pin junction cell units being stacked between a conductive substrate and a transparent conductive thin film.

Explanation is to be made about the above mentioned short-circuited defective solar cell which can be repaired according to the present invention.

Conductive Substrate 102

The conductive substrate 102 may be comprised only of a conductive member having a conductive surface which is made of a metal such as stainless steel, aluminum, etc.

In an alternative, the conductive substrate 102 may be a member comprising a conductive or insulating base member 102a made of a metal such as stainless steel, aluminum, etc. or an insulating material such as glass, quartz, synthetic resin, etc. which is applied with a conductive thin film 102b comprising $MgF_2$, ZnO, $TiO_2$, ITO ($In_2O_3+SnO_2$), $In_2O_3$, $SnO_2$, Ag, Al, Cr or the like to the surface thereof by a vacuum evaporation method or a sputtering method. The conductive thin film 102b may be a multilayered thin film comprising a plurality of thin films of $MgF_2$, ZnO, $TiO_2$, ITO (In- $_2O_3+SnO_2$), $In_2O_3$, $SnO_2$, Ag, Al, Cr or the like being stacked.

Photoelectric Conversion Layer 103 (pin junction semiconductor layer)

The photoelectric conversion layer 103 may be a pin junction semiconductor thin film comprising a non-single crystal material containing silicon atoms as the main constituent such as silicon-containing amorphous materials e.g. amorphous silicon, amorphous silicon carbide or amorphous silicon germanium, microcrystalline silicon materials or polycrystalline silicon materials which can be formed by a plasma CVD method, a light CVD method, a thermal CVD method, a vacuum evaporation method, a sputtering method or an annealing method. In an alternative, the photoelectric conversion layer 103 may be a pin junction semiconductor thin film comprising CdS, CdTe, $CuInSe_2$ or the like which can be formed by a vacuum evaporation method or a screen printing method.

Conductive Thin Film 104

The conductive thin film 104 may be a single conductive thin film comprising $MgF_2$, ZnO, $TiO_2$, ITO ($In_2O_3+SnO_2$), $In_2O_3$, $SnO_2$, Ag, Al, Cr or the like which is formed by a vacuum evaporation method or a sputtering method. In an alternative, the conductive thin film 104 may be a multilayered thin film comprising a plurality of thin films of $MgF_2$, ZnO, $TiO_2$, ITO ($In_2O_3+SnO_2$), $In_2O_3$, $SnO_2$, Ag, Al, Cr or the like being stacked which is formed by a vacuum evaporation method or a sputtering method.

In the process of preparing such solar cell as above mentioned, one or more pinholes are unavoidably caused in such a state as shown in FIG. 1.

That is, in the case of preparing such solar cell as above mentioned, for instance, an about 1.0 μm thick ZnO thin film as the conductive thin film 102b is formed on a stainless steel plate as the base member by a sputtering method. Then, an about 0.5 μm thick pin junction photoelectric conversion semiconductor layer (solar cell element) comprising a non-single crystal Si thin film as the pin junction semiconductor layer 103 is formed on the ZnO thin film by a plasma CVD method. Successively, an about 0.07 μm thick indium oxide thin film as the transparent and conductive thin film 104 is formed on the pin junction photoelectric conversion semiconductor layer by a vacuum evaporation method.

In this case, one or more pinholes are unavoidably caused within the resulting device as shown in FIG. 1. That is, such pinholes indicated by 106a and 106b are caused during the process of forming the pin junction semiconductor layer 103. Specifically, these pinholes are caused due to removal of the pin junction semiconductor layer 103 from the conductive thin film 102b which occur as a result of depositing minute dusts removed from the materials of the plasma CVD deposition chamber circumscribing the film-forming space on the surface of the conductive substrate 102 (specifically, the conductive thin film 102b) upon forming the pin junction semiconductor layer 103. Other than this, these pinholes are also caused due to removal of a partial layer region of the pin junction semiconductor layer 103 from the conductive substrate 102 (specifically, the conductive thin film 102b) because of an internal stress of said semiconductor layer or because of poor adhesion of said semiconductor layer with the conductive substrate 102.

Further in addition, these pinholes are caused in the case of forming a transparent and conductive thin film 104 on the previously formed pin junction semiconductor layer 103 in a state of being apt to cause pinholes because of its internal stress or/and the foregoing minute dusts.

In any of these cases, a short-circuited portion comprising the pinhole 106a or/and a short-circuited portion comprising the pinhole 106b is caused. Because of this, when a transparent and conductive thin film 104 is formed on the pin junction semiconductor layer 103, the resulting transparent and conductive thin film 104 is short-circuited with the conductive thin film 102b of the conductive substrate 102 through such a pinhole.

Now, in the case of preparing a large area solar cell having a pin junction semiconductor layer comprising a non-single crystal silicon material such as amorphous silicon material as the photoelectric conversion layer, it is desired to form said pin junction semiconductor layer by using a so-called roll-to-roll type continuous plasma CVD apparatus as disclosed in U.S. Pat. No. 4,400,409, U.S. Pat. No. 4,438,723 or U.S. Pat. No. 4,438,724.

The roll-to-roll type continuous plasma CVD apparatus comprises a plurality of film-forming chambers being integrated while isolating one from the other through respective isolating means, wherein each deposition chamber is capable of continuously forming a deposited semiconductor film of n-, i- or p-type on a lengthy and wide substrate web by causing glow discharge in the presence of appropriate film-forming raw material gas therein while transporting said substrate web through each of said plurality of deposition chambers in the lengthwise direction.

Hence, it is possible to continuously form an element provided with one or more semiconductor junctions on a large area substrate in the above mentioned roll-to-roll type continuous plasma CVD apparatus.

As above described, the present invention makes it possible to always provide a practically usable solar cell while repairing a defective solar cell provided with one or more short-circuited portions if such defective solar cell has resulted.

Figure 2:
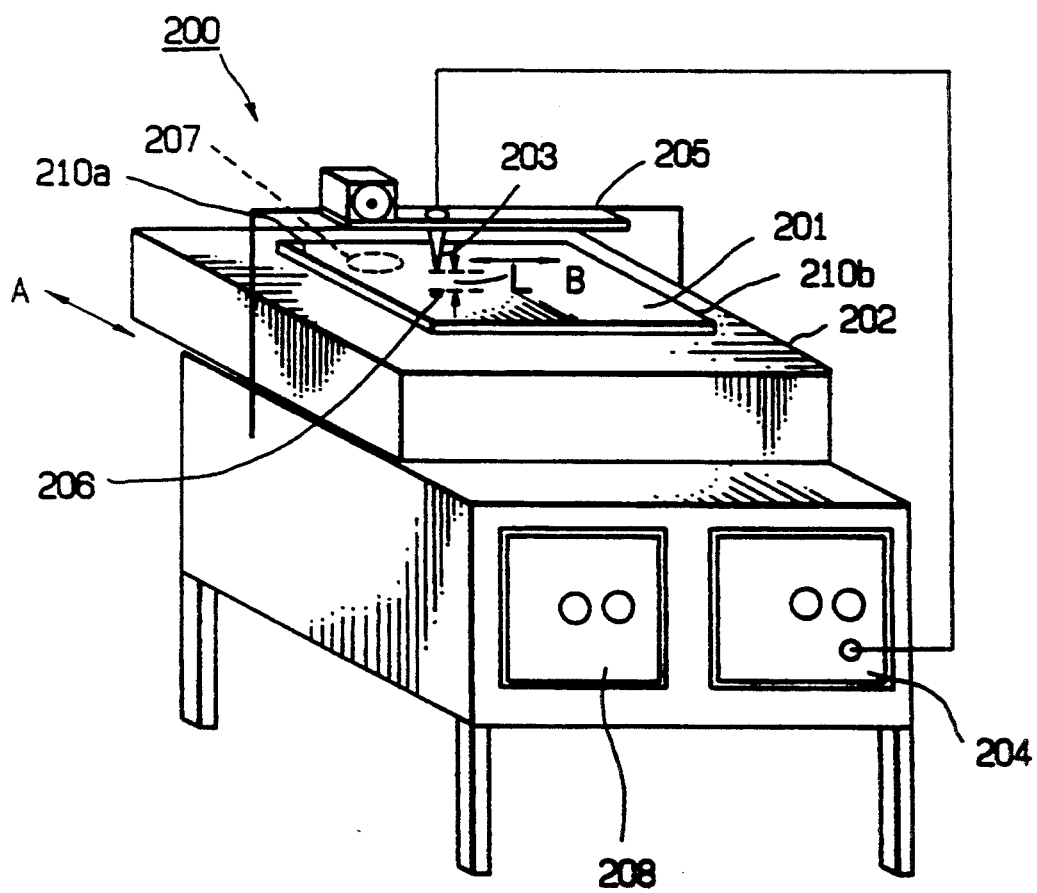
FIG. 2 is a schematic diagram of an apparatus suitable for practicing a first embodiment of the method for repairing a defective semiconductor device, according to the present invention.

Shown in FIG. 2 is an apparatus which is suitable for practicing the method of repairing such a defective solar cell as previously described according to the present invention.

In FIG. 2, numeral reference 200 stands for the entire apparatus. Numeral reference 201 stands for a solar cell being positioned on a mounting table 202 as the substrate holding means. The mounting table 202 is structured such that it can horizontally move back and forth in respective arrow directions shown by either A or B. Numeral reference 203 stands for a probe being arranged over the solar cell 201. The probe 203 is electrically connected to a high AC voltage-outputting power source 204 as the voltage applying means. The AC voltage-outputting power source 204 (voltage applying means) is provided with a control circuit (not shown in the figure). The probe 203 is so designed that it can horizontally move back and forth in the respective arrow directions shown by B along a guide rail 205 being arranged at the position above the solar cell 201 by the action of a scanning means (not shown in the figure). The direction of A is rectangular, that is, perpendicular, to the direction of B. By this, the probe 203 is made capable of scanning the entire of the surface of the solar cell 201. Numeral reference 208 stands for a controller for controlling the mounting table 202 to be moved in the direction as desired. The guide rail 205 is electrically isolated from the probe 203 through an insulating material such as aluminaceramics (not shown in the figure). This apparatus is provided with a counter electrode (not shown in the figure) to the probe 203 such that the distance between the counter electrode and the probe 203 can be optionally changed. The counter electrode is electrically grounded.

A predetermined AC voltage from the AC voltage-outputting power source 204 (voltage applying means) is applied to the probe 203 upon performing repair treatment for the solar cell 201, wherein a discharge (spark) is caused when the probe 203 is situated above the portion of the solar cell 201 in which a short-circuited portion due to a pinhole is present.

In the above control circuit for the AC voltage-outputting power source 204 (voltage applying means), there are memorized data of predetermined operating parameters with respect to the interrelation between (a) the distance (L) between the probe 203 and the counter electrode and (b) the threshold (Vth) of an AC voltage at which the discharge (spark) is caused in an atmospheric air when the distance between the probe 203 and the counter electrode is L.

In the following, explanation is to be made about the preparation of a practically usable solar cell according to the present invention using the above apparatus by illustrating a typical example.

Firstly, there is prepared a solar cell as the solar cell 201 shown in FIG. 2 by providing a stainless steel plate, for example, of 100 mm × 100 mm in size and 1.0 mm in thickness as the base member 102a shown in FIG. 1; forming a conductive thin film comprising zinc oxide (ZnO) as the conductive thin film 102b shown in FIG. 1 on said stainless plate by a sputtering method; forming a pin junction amorphous silicon semiconductor layer as the photoelectric conversion semiconductor layer 103 shown in FIG. 1 on said conductive thin film by a plasma CVD method; and forming a transparent and conductive thin film comprising ITO as the conductive thin film 104 shown in FIG. 1 on said pin junction amorphous silicon semiconductor layer by a vacuum evaporation method.

The solar cell 201 thus obtained is positioned on the mounting table 202 of the apparatus 200 shown in FIG. 2, wherein the conductive substrate 102 of the solar cell 201 is electrically grounded. Then, the probe 203 is positioned above the solar cell 201 while leaving a distance of about 5.0 mm between the top of the probe 203 and the surface of the solar cell 201. Predetermined data with respect to the foregoing distance (L) are inputted in the control circuit (L) for the AC voltage-outputting power source 204 (voltage applying means) so as to enable it to adjust the AC voltage to be applied to the probe 203 upon causing the foregoing discharge (spark) between the probe 203 and the counter electrode through the solar cell 201. Successively, the probe 203 is positioned such that it is situated at the position right above a corner of the solar cell 201. Then, the AC voltage from the AC voltage-outputting power source 204 (voltage applying means) is raised to a level corresponding to the foregoing threshold voltage. By operating the controller, the solar cell 201 on the mounting table 202 is then continuously moved horizontally and back and forth in the arrow directions of B, wherein every time when the probe 203 arrives at an end indicated by 210a or at the other end indicated by 210b, the solar cell 201 is horizontally moved some millimeter in the direction of A, whereby the surface of the solar cell 201 is scanned by the probe 203. In this case, when the probe 203 arrives at the position above the surface portion comprising transparent and conductive thin film of the solar cell 201 in which a short-circuited portion due to a pinhole, e.g., 206, is present, a discharge (spark) is caused between the probe 203 applied with the threshold voltage and said portion of the solar cell and the spark passes therebetween because the latter is in a earthed potential state due to said short-circuited portion, wherein said short-circuited portion is fused to establish an electrically insulating state. On the other hand, such a discharge (spark) is not caused for other portions of the solar cell, e.g., 207, not containing such short-circuited portions when the probe 203 arrives at the position above the surface of said portion of the solar cell while applying the threshold voltage to the probe.

In this way, a defective solar cell can be easily repaired to be a practically usable solar cell.

Figure 3:
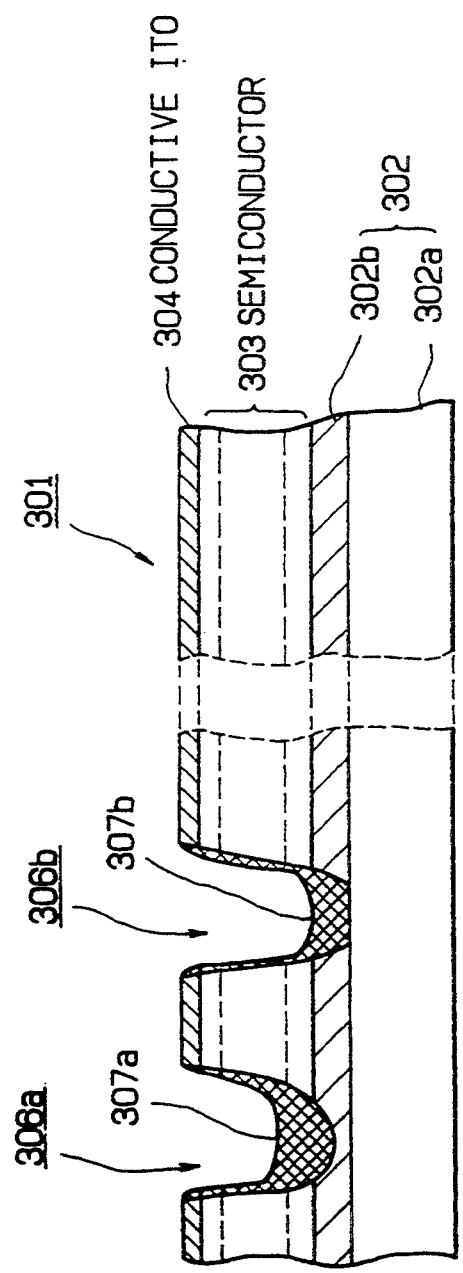
FIG. 3 is a schematic cross section view of a desirably repaired semiconductor device in accordance with the method for repairing a defective semiconductor device, according to the present invention.

FIG. 3 is a schematic view illustrating the situation wherein the short-circuited portion of the solar cell is repaired in the above. In FIG. 3, numeral reference 301 corresponds to the foregoing solar cell 101 (the solar cell 201 in FIG. 2); numeral reference 302 corresponds to the foregoing conductive substrate 102; numeral reference 302a corresponds to the foregoing base member 102a comprising a stainless steel plate; numeral reference 302b corresponds to the foregoing conductive thin film 102b comprising a ZnO thin film; numeral reference 303 corresponds to the foregoing photoelectric conversion semiconductor layer 103 comprising a pin junction amorphous silicon semiconductor layer; numeral reference 304 corresponds to the foregoing transparent and conductive thin film 104 comprising an ITO film; numeral reference 306a corresponds to the foregoing pinhole 106a; and numeral reference 306b corresponds to the foregoing pinhole 106b. And, numeral references 307a and 307b indicate respectively a fused product deposited at the bottom of the pinhole 306a and a fused product deposited at the bottom of the pinhole 306b.

In the above process, when the probe 203 arrives at the position above the surface portion (comprising the ITO transparent and conductive thin film) of the solar cell in which a short-circuited portion comprising the pinhole 306a or/and a short-circuited portion comprising the pinhole 306b respectively occurring at a portion of the pin junction amorphous silicon semiconductor layer is present while applying a predetermined AC voltage to the probe 203, a spark discharge current is flown only through a limited minute region of the solar cell which contains the pinhole 306a or 306b to cause a Joule heat which results in fusing the peripheries circumscribing the pinhole (the peripheries including a portion each of the ZnO conductive thin film 302b, the pin junction amorphous silicon semiconductor layer 303 and the ITO transparent and conductive thin film 304), whereby depositing a fused product 307a or/and a fused product 307b at the bottom of the pinhole 306a or/and at the bottom of the pinhole 306b in such a state as shown in FIG. 3. As a result, the short-circuited portion caused due to the pinhole 306a or/and the short-circuited portion caused due to the pinhole 306b is made in an electrically insulating state. Because of this, the resulting solar cell becomes such that provides photovoltaic characteristics desired for a solar cell. In this case, even if the fused product 307a or/and the fused product 307b were deposited in a state of being in contact with the conductive thin film 302b or the base member 302a, there is not any undesirable problem for the resulting repaired solar cell. That is, the fused product 307a or-/and the fused product 307b is in an oxidized state or-/and a nitrogenized state because of chemical reaction with oxygen or/and nitrogen of the atmospheric air upon their formation and has a high electrical resistivity similar to that of a semiconductor; because of this, the density of a leakage current which flows through such contacted portion becomes to be more or less around the same as the density of a leakage current which flows through the pin junction amorphous silicon semiconductor layer 303.

The probe to be used in the present invention is desired to be such that is of a few millimeter in diameter and has a sharply pointed top. The probe is made of a metal through which an electric current is allowed to flow such as copper, gold, silver, iron, nickel, stainless steel, etc.

In the present invention, the distance L between the top of the probe and the surface of a defective semiconductor device to be repaired is an important factor. The system for practicing the repairing method of the present invention is designed such that said distance L can be finely adjusted depending upon the kind of the constituent of a photoelectric conversion semiconductor layer of a defective semiconductor device to be repaired, the voltage withstanding pressure of a semiconductor device to be repaired, the pressure of an atmosphere wherein the repairing process is performed, or the like. For instance, in the case where the voltage withstanding pressure of the photoelectric conversion semiconductor layer of a defective semiconductor device to be repaired is small, it is desired to make the foregoing distance small and to lower the AC voltage to be applied.

In the present invention, the above repairing method can be performed also in an atmosphere of a reduced pressure. In this case, when the repairing method is performed while maintaining the distance L at the same level as in the case of performing the repairing method in an atmospheric air, it is desired to lower the AC voltage to be applied to a value less than the threshold voltage because the discharge commencing voltage becomes small.

The distance L between the top of the probe and the surface of a defective semiconductor device to be repaired upon repairing said defective semiconductor device by the repairing method of the present invention should be properly decided on the basis of what is above described.

However, in general, said distance L is desired to be about 0.5 to about 10 mm. Likewise, as for the AC voltage to be applied, it is desired to be of a value of some hundreds of volts to some ten thousands of volts.

In the present invention, the voltage to be applied to the probe is not limited to the above AC voltage. Thus, it is possible to use any other kind of voltage of DC to high frequency (some hundreds kHz).

In fact, in the case where the photoelectric conversion semiconductor layer of a defective semiconductor device to be repaired is such that is of a high melting point and cannot be easily fused, it is desired to employ a DC voltage. On the other hand, in the case where the photoelectric conversion semiconductor layer of a defective semiconductor device to be repaired is such that can be easily fused, it is desired to employ an AC voltage.

The AC voltage can be of an appropriate waveform such as sine wave, rectangular wave, exponential wave, or the like.

As for the current density of an electric current flown from the probe during the repairing process, it should be properly decided while having due regards on the size of a pinhole present in a defective semiconductor device to be repaired, the constituent of the photoelectric conversion semiconductor layer of said semiconductor device, leakage current of said semiconductor device, and other related factors. However, in general, it is desired to be of a value of about 0.01 to about 100 A/cm$^2$.

Further, as for the pressure of an atmosphere wherein the repairing method of the present invention is performed, it can be an atmospheric pressure in a usual case.

However, in the case of incorporating oxygen atoms or/and nitrogen atoms into the resulting fused product such as the fused product 307a or 307b shown in FIG. 3 to thereby increase its electrical resistivity, it is desired to perform the repairing method of the present invention in an atmosphere of reduced pressure. As for the apparatus to be employed in this case, it can be a substantially enclosed apparatus comprising the entire of the apparatus shown in FIG. 2 being housed in a hermetically sealed vessel and which is provided with an evacuating system including a vacuum pump. In this case, the repairing method of the present invention is performed in said apparatus while introducing gas containing oxygen atoms or/and nitrogen atoms into the hermetically sealed vessel and maintaining the inner pressure at a desired vacuum degree by operating the evacuating system.

As the oxygen atom-containing gas usable in this case, there can be illustrated $O_2$, $O_3$, $CO_2$, CO, NO, $NO_2$, etc. These gases may be diluted with an appropriate dilution gas such as Ar, He, Ne, $H_2$, etc. upon introducing them into the above hermetically sealed vessel.

Likewise, as the nitrogen-containing gas usable in this case, there can be illustrated $N_2$, NO, $NO_2$, etc. As well as in the case of the oxygen-containing gas, these nitrogen-containing gases may be diluted with an appropriate dilution gas such as Ar, He, Ne, $H_2$, etc. upon introducing them into the above hermetically sealed vessel.

Figures 4A, 4B:
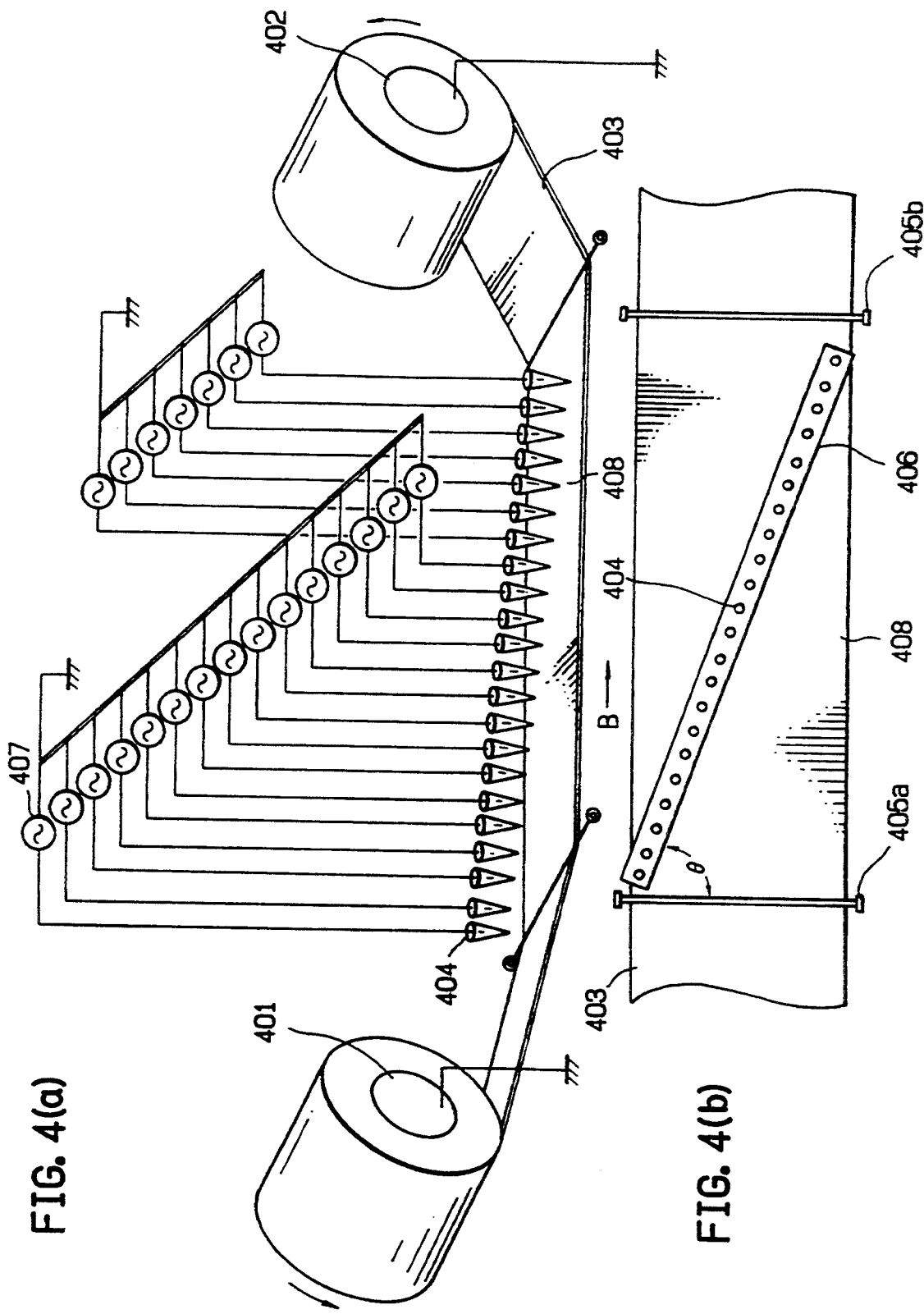
FIGS. 4(a) and 4(b) is a schematic diagram of an apparatus suitable for practicing a second embodiment of the method for repairing a defective semiconductor device, according to the present invention.

Shown in FIG. 4 is a schematic view of another apparatus suitable for practicing the repairing method of the present invention.

In FIG. 4, numeral reference 401 stands for a feed roller on which a lengthy, or continuous conductive substrate web 403 having a solar cell element with an ITO transparent and conductive thin film 408 thereon (hereinafter referred to as solar cell web) is wound, and the feed roller 401 serves to feed the solar cell web 403. Numeral reference 402 stands for a take-up roller which serves to take up the solar cell web 403 fed by the feed roller 401. The solar cell web 403 is fed from the feed roller 401, followed by being transported for a certain distance in the direction indicated by an arrow B, that is, toward the take-up roller 402 by the action Of the take-up roller 402 while being maintained in a horizontal state by means of two positioning rollers 405a and 405b respectively capable of moving upwards or downwards, and taken up on the take-up roller 402. Both the feed roller 401 and the take-up roller 402 are electrically grounded. Since the rear face of the solar cell web 403 is in contact with the feed roller 401 and also with the take-up roller 402, the solar cell web is electrically grounded through these rollers. A plurality of probes 404 are arranged at an equal interval above the solar cell web 403 being transported toward the take-up roller 402. Each of these probes is of the same configuration as that of the probe 203 shown in FIG. 2. And these probes 404 are electrically isolated one from the other by an insulator 406. Each of these probes is connected to an independent AC voltage-outputting power source 407.

The probes 404 are arranged at an equal interval and on an identical apparent straight line such that the direction of these probes 404 being arranged is in parallel with a solar cell region of the solar cell web 403 and the distance between the surface of the solar cell web 403 and the top of each of these probes 404 is identical as shown in FIG. 4.

In more detail in this respect, the probes 404 are arranged such that the angle Θ made by the apparent straight line on which the probes 404 being arranged and the width direction of the solar cell web 403 becomes large and the distance between the surface of the solar cell web 403 and the top of each of the probes 404 becomes large as much as possible.

The distance between the surface of the solar cell web 403 and the top of each of the probes 404 can be properly adjusted by moving the positioning rollers 405a and 405b.

The repairing method of the present invention can be properly performed in the above apparatus, for instance, in the following manner.

That is, firstly, there is provided a solar cell element 403 with an ITO transparent and conductive thin film thereon (hereinafter referred to as solar cell web). The solar cell web is wound on the feed roller of the apparatus shown in FIG. 4. Then, the solar cell web 403 is fed from the feed roller 401, and one end of the solar cell web thus fed is fixed to the take-up roller 402 and wound thereon. By adjusting the positioning rollers 405a and 405b, the distance between the surface of the solar cell web 403 and the top of each of the probes 404 is made constant at about 4.0 mm. Both the feed roller 401 and the take-up roller 402 start rotating to transport the solar cell web 403 at a speed of 30 mm/sec in the direction B. At the same time, each of the AC voltage outputting power sources 407 is switched on to output about 20,000 volt. During this process, a spark (discharge) is intermittently caused at the portion of the solar cell web 403 being transported. By this, it can be recognized that portions of the solar cell web 403 in which short-circuited portions due to pinholes occurring at the photoelectric conversion semiconductor layer are repaired.

The repairing process in this case is terminated when the entire of the solar cell web 403 is wound on the take-up roll 402, wherein the AC voltage-outputting power source is switched off and the rotation of each of the feed roller 401 and the take-up roller 402 is stopped. Then, the resultant solar cell web is taken out.

Shown in FIG. 5 is a further apparatus suitable for practicing the repairing method of the present invention. The apparatus shown in FIG. 5 is of the constitution that part of the apparatus shown in FIG. 4 is housed in a hermetically sealed vessel (hereinafter referred to as vacuum vessel). The repairing method of the present invention using this apparatus is performed in an atmosphere of reduced pressure while introducing gas containing oxygen atoms or/and nitrogen atoms into the hermetically sealed vessel. The constitution shown in the space encircled by a broken line C is similar to the constitution of the apparatus shown in FIG. 4.

In FIG. 5, numeral reference 503 stands for a vacuum vessel in which a feed roller 505 for feeding a solar cell web 504; a take-up roller 506 for taking up the solar cell web 504 fed from the feed roller 505; a plurality of probes 508 being arranged above the surface of the solar cell web (each of the probes 508 being separately connected to an identical AC voltage-outputting power source 502 being situated outside the vacuum vessel 503); and a pair of positioning rollers 507 are contained. The vacuum vessel 503 is provided with a vacuum gauge 518. The vacuum vessel 503 is provided with an exhaust pipe being connected through an exhaust valve 509 to an exhaust system containing a rotary pump 512 and a mechanical booster pump 513. Numeral reference 517 stands for a leak valve mounted to a leak pipe being connected to the vacuum vessel 503. Numeral reference 516 stands for a reservoir provided with a header valve which contains a gaseous mixture comprising $O_2$ gas and Ar gas which is connected through a gas feed pipe 514 to the vacuum vessel 503. The gas feed pipe 514 is provided with a mass flow controller 515 and an inlet valve 510.

The repairing method of the present invention using the apparatus shown in FIG. 5 is performed, for instance, in the following manner.

That is, first, there is provided a solar cell element 504 with an ITO transparent and conductive thin film thereon (hereinafter referred to as solar cell web). The solar cell web 504 is introduced into the vacuum vessel 503 and it is wound on the feed roller 505. Then, the solar cell web 504 is fed from the feed roller 505, and one end of the solar cell web thus fed is fixed to the take-up roller 506 and wound thereon. By adjusting the positioning rollers 507, the distance between the surface of the solar cell web 403 and the top of each of the probes 404 is made constant at about 2.0 mm. Then, the vacuum vessel 503 is hermetically closed. Confirming that the exhaust valve 509, the inlet valve 510, the header valve 511 and the leak valve 517 are closed, the rotary pump 512 is actuated, and the exhaust valve 509 and the inlet valve 510 are gradually opened. When the reading on the vacuum gage 518 reaches about 10 Torr, the mechanical booster pump 513 is actuated to sufficiently evacuate the inside of the vacuum vessel 503 through the gas feed pipe 514 including the mass flow controller 515 to a vacuum of less than 10 mTorr. Then, the header valve of the gas reservoir 516 is opened, and the flow rate of the gaseous mixture from the gas reservoir 516 is made to be about 100 sccm by adjusting the mass flow controller 515. Thereafter, both the feed roller 505 and the take-up roller 506 start rotating to transport the solar cell web 504 at a speed of 30 mm/sec in the lengthwise direction of the solar cell web. At the same time, the AC voltage outputting power sources 502 is switched on to apply a predetermined voltage to each of the probes 508. During this process, a spark (discharge) is intermittently caused at the portion of the solar cell web 504 being transported. By this, it can be recognized that portions of the solar cell web 504 in which short-circuited portions due to pinholes occurred at the photoelectric conversion semiconductor layer are present are repaired.

The repairing process in this case is terminated when the entire of the solar cell web 504 is wound on the take-up roll 506, wherein the AC voltage-outputting power source is switched off and the rotation of each of the feed roller 505 and the take-up roller 506 is stopped. At the same time, the valves 510 and 509 are closed, and the leak valve 517 is gradually opened to thereby return the inside of the vacuum vessel 503 to atmospheric pressure. Then, the resultant solar cell web is taken out.

The semiconductor device repaired according to the present invention is subjected to finalizing treatments such as wiring, packaging with the use of an insulating member, and the like, to obtain a semiconductor device product.

For instance, in the case where a large area solar cell web has been repaired, it is cut into a plurality of solar cell elements respectively of a predetermined size, each of the resultant solar cell elements is applied with a collecting electrode (105 in FIG. 1) to the surface of the transparent and conductive thin film (104 in FIG. 1), and they are integrated to obtain a plurality of solar cell modules.

Likewise, in the case where a semiconductor device has been repaired for use in photosensor, the resultant is applied with a passivation film to the surface thereof, which is then mounted on a support member for photosensor together with a light source, lens, etc.

The present invention will be described more specifically while referring to the following examples, but the present invention is not to be limited in scope by these examples.

EXAMPLE 1

In this example, description is to be made about the case where the repairing method of the present invention is applied in repairing a pin junction amorphous silicon solar cell device having one or more short-circuited portions, using the apparatus shown in FIG. 2.

Firstly, there was provided a stainless steel plate of 100 mm × 100 mm in size and 1.0 mm in thickness. This stainless steel plate was well cleaned in a cleaning vessel. The resultant cleaned stainless steel plate was used as the base member of the pin junction amorphous silicon solar cell device.

On the stainless steel plate as the base member was formed a 1.0 μm thick ZnO transparent electrode by a vacuum evaporation method. Successively, an about 0.5 μm thick pin junction amorphous silicon semiconductor layer was formed on the previously formed ZnO transparent electrode by a plasma CVD method. Then, on the pin junction amorphous silicon semiconductor layer thus formed was formed an about 0.07 μm thick ITO transparent and conductive thin film by a vacuum evaporation method. In this way, there were prepared a number of pin junction amorphous silicon solar cell elements.

Figure 6A:
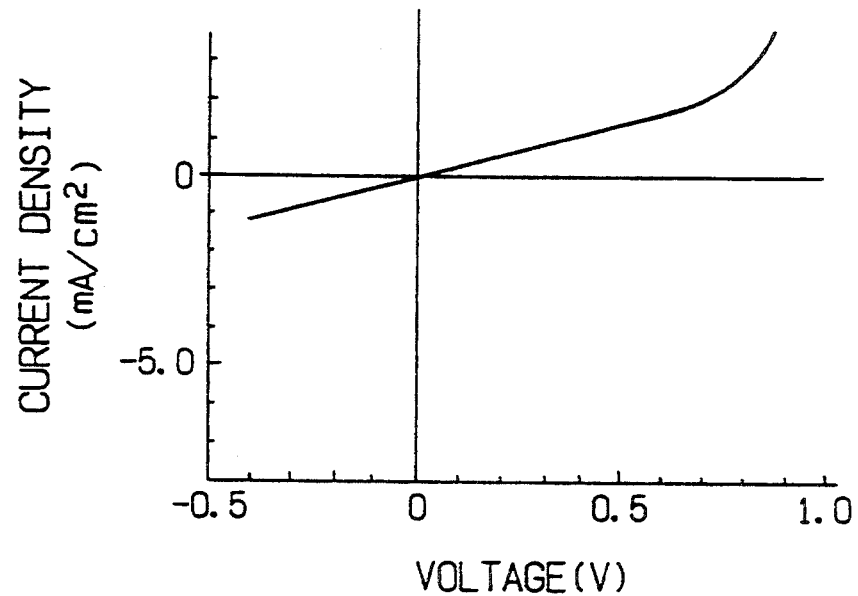
FIG. 6(A) is a graph showing current/voltage characteristics of a semiconductor device in which a short-circuited portion is present and which does not have a diode property.

As for each of the resultant pin junction amorphous silicon solar cell elements, its current/voltage characteristics in a dark state were examined by a conventional method. As a result, more than twenty of the pin junction amorphous silicon solar cell elements thus obtained were such that exhibit such characteristics shown in FIG. 6(A). From this result, it was found that these pin junction amorphous silicon solar cell elements do not exhibit diode characteristics and because of this, they are such that have one or more short-circuited portions as shown in FIG. 1.

Figure 6B:
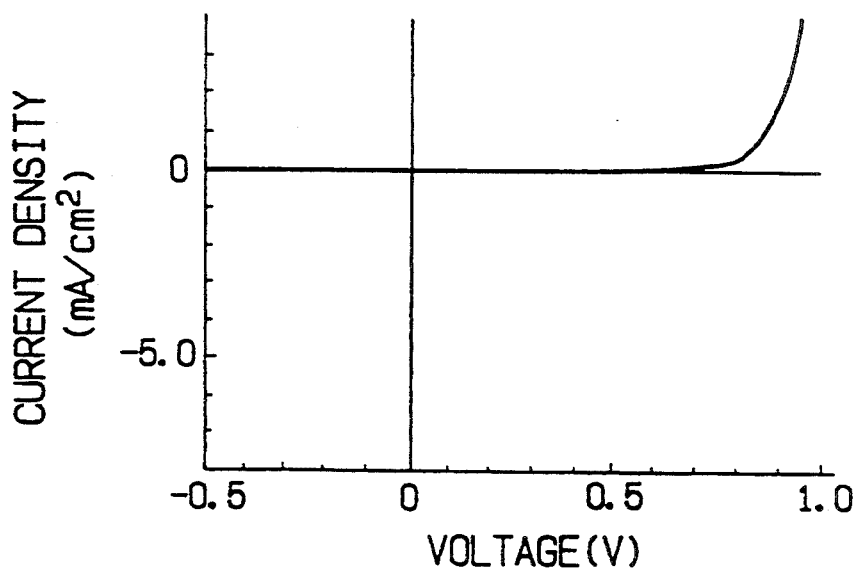
FIG. 6(B) is a graph showing current/voltage characteristics of a semiconductor device in which the short-circuited portion has been repaired and which has a diode property.

Thus, twenty of those defective pin junction amorphous silicon solar cell elements were randomly selected. And each of them was positioned on the mounting table 202 of the apparatus shown in FIG. 2, and it was repaired in the same manner as described in the case of performing the repairing method using this apparatus, wherein the distance L between the top of the probe 203 and the surface of the ITO transparent and conductive thin film of the pin junction amorphous silicon solar cell element was maintained constant at 5.0 mm, and the AC voltage-outputting power source 208 was adjusted to apply about 20,000 volt to the probe 203 in a state of not causing discharge (spark). The travelling speed of the probe 203 was made to be 25 mm/sec., whereas the mounting table 202 was moved at a speed of 5.0 mm/sec. intermittently every four seconds. The foregoing twenty defective pin junction amorphous silicon solar cell elements were thus repaired. As for each of the resultant twenty pin junction amorphous silicon solar cell elements thus repaired, its current/voltage characteristics in a dark state were examined. As a result, it was found that any of the twenty repaired pin junction amorphous silicon solar cell elements exhibits such desirable diode characteristics as shown in FIG. 6(B). It was also found as for each of the twenty repaired pin junction amorphous silicon solar cell elements that the repaired portions are in such a desirable state as shown in FIG. 3.

Figure 7:
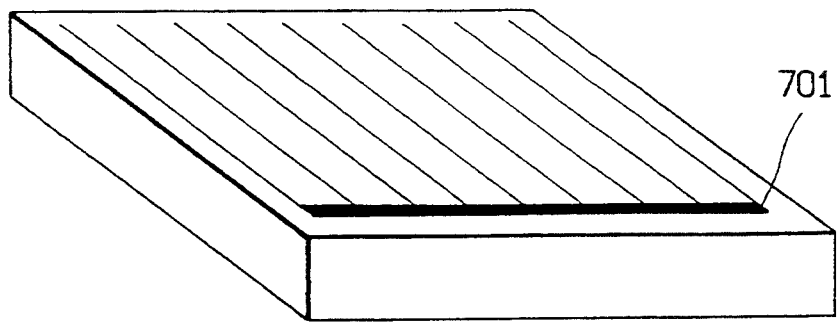
FIG. 7 is a schematic explanatory view of a solar cell as the semiconductor to be produced according to the present invention.

On the ITO transparent and conductive thin film of each of the foregoing twenty repaired pin junction amorphous silicon solar cell elements was formed a 1.0 um thick Ag collecting electrode of the configuration indicated by numeral reference 701 in FIG. 7 by a vacuum evaporation method, to thereby obtain twenty pin junction amorphous silicon solar cell devices.

As for each of the resultants, its current/voltage characteristics in a dark state were examined. As a result, it was found that any of the resultant twenty pin junction amorphous silicon solar cell devices are satisfactory in current/voltage characteristics.

Further, each of the resultant twenty pin junction amorphous silicon solar cell devices was allowed to stand outdoors for two months. And its current/voltage characteristics in a dark state were examined. As a result, eighteen of the twenty solar cell devices were still satisfactory in current/voltage characteristics.

As for each of the twenty pin junction amorphous silicon solar cell devices, it was subjected to measurement of photoelectric conversion efficiency under irradiation of AM 1.5 light.

As a result, it was found that the foregoing eighteen pin junction amorphous silicon solar cell devices provide a satisfactory photoelectric conversion efficiency of more than 10%.

COMPARATIVE EXAMPLE 1

Firstly, there was provided a stainless steel plate of 100 mm × 100 mm in size and 1.0 mm in thickness. This stainless steel plate was well cleaned in a cleaning vessel. The resultant cleaned stainless steel plate was used as the base member of the pin junction amorphous silicon solar cell device.

On the stainless steel plate as the base member was formed a 1.0 μm thick ZnO transparent electrode by a vacuum evaporation method. Successively, an about 0.5 μm thick pin junction amorphous silicon semiconductor layer was formed on the previously formed ZnO transparent electrode by a plasma CVD method. Then, on the pin junction amorphous silicon semiconductor layer thus formed was formed an about 0.07 μm thick ITO transparent and conductive thin film by a vacuum evaporation method. Thus, there was obtained a pin junction amorphous silicon solar cell element.

The above procedures were repeated, to thereby obtain twenty pin junction amorphous silicon solar cell elements in total.

As for each of the resultant twenty pin junction amorphous silicon solar cell elements, its current/voltage characteristics in a dark state were examined by a conventional method. As a result, it was found that nine of the twenty pin junction amorphous silicon solar cell elements do not exhibit diode characteristics and because of this, they have one or more short-circuited portions as shown in FIG. 1.

As for the remaining eleven pin junction amorphous silicon solar cell elements, it was found that they are not so good in diode characteristics.

As for each of these eleven pin junction amorphous silicon solar cell elements, on the ITO transparent and conductive thin film was formed a 1.0 μm thick Ag collecting electrode of the configuration indicated by numeral reference 701 in FIG. 7 by a vacuum evaporation method, to thereby obtain a pin junction amorphous silicon solar cell device. Thus, there were obtained eleven pin junction amorphous silicon solar cell devices in total.

As for each of the resultant eleven pin junction amorphous silicon solar cell devices, its current/voltage characteristics in a dark state were examined. As a result, it was found that they are inferior to the pin junction amorphous silicon solar cell devices obtained in Example 1 in view of diode characteristics.

Further, each of the eleven pin junction amorphous silicon solar cell devices was allowed to stand outdoors for two months. And its current/voltage characteristics in a dark state were examined. As a result, only four of the eleven solar cell devices were still practically acceptable in view of current/voltage characteristics.

As for each of the eleven pin junction amorphous silicon solar cell devices, it was subjected to measurement of photoelectric conversion efficiency under irradiation of AM 1.5 light.

As a result, it was found that any of the eleven pin junction amorphous silicon solar cell devices provides a practically acceptable photoelectric conversion efficiency.

A mean value among the photoelectric conversion efficiencies of the eleven pin junction amorphous silicon solar cell devices was calculated. And the mean value was compared with the mean value among the photoelectric conversion efficiencies of the twenty pin junction amorphous silicon solar cell devices obtained in Example 1.

As a result, it was found that the mean value of Example 1 is surpassing the mean value of Comparative Example 1 by 1.33 holds.

EXAMPLE 2

In this example, description is to be made about the case where the repairing method of the present invention is applied in repairing a pin type amorphous silicon diode photosensor having one or more short-circuited portions, using the apparatus shown in FIG. 2.

Figure 8:
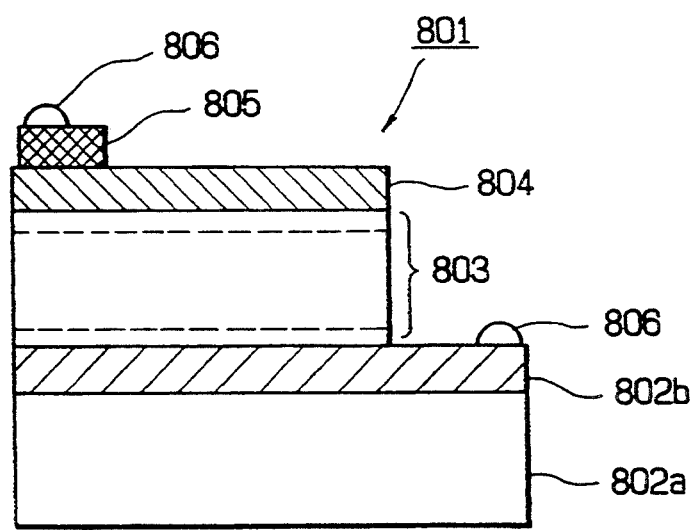
FIG. 8 is a schematic explanatory view of a photosensor as the semiconductor to be produced according to the present invention.

FIG. 8 is a schematic cross-section view of the configuration of the photosensor.

In FIG. 8, numeral reference 801 stands for the entire photosensor chip. The photosensor chip 801 comprises a conductive substrate comprising a base member 802a (a glass plate) and a conductive thin film electrode 802b being disposed on said glass plate; a pin type amorphous silicon semiconductor layer 803 being disposed on said conductive substrate; and a transparent and conductive thin film electrode 804 being disposed on said pin type amorphous silicon semiconductor layer. Numeral reference 805 stands for a leading electrode disposed on the transparent and conductive thin film electrode 804. Numeral reference 806 stands for a lead frame.

Figure 9A:
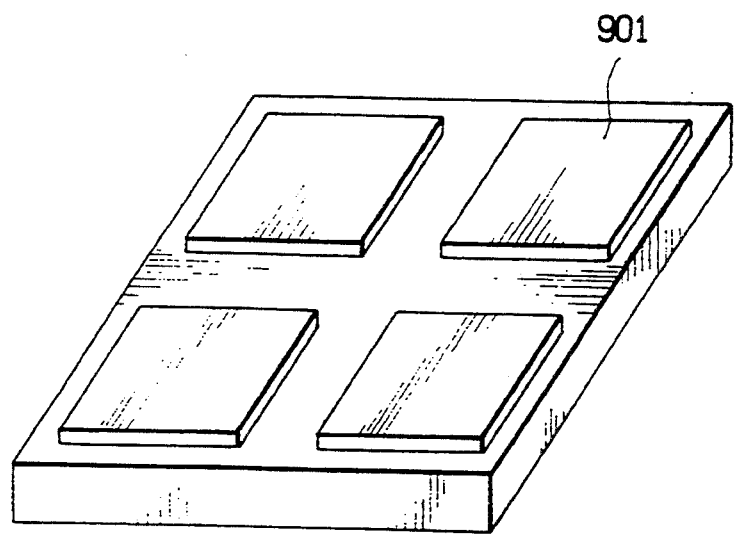
FIGS. 9(A), 9(B) and 9(C) are schematic views respectively for explaining the process for preparing the photosensor shown in FIG. 8.

Firstly, there was provided a glass plate of 100 mm × 100 mm in size and 1.0 in thickness as the base member 802a. This glass plate was well cleaned in a cleaning vessel. On the glass plate thus cleaned was formed a 1.0 μm thick aluminum conductive film as the conductive thin film electrode 802b by a vacuum evaporation method. Then, the resultant was subjected to photolithography whereby the conductive thin film was patterned to be such a configuration as shown by numeral reference 901 in FIG. 9(A). Successively, an about 0.8 μm thick pin type amorphous silicon semiconductor layer was formed thereon by a plasma CVD method. On the pin type amorphous silicon semiconductor layer thus formed was formed an about 0.07 μm thick ITO transparent and conductive film as the transparent and conductive thin film electrode 804 by a vacuum evaporation method, to thereby obtain a photosensor element.

The resultant photosensor element was positioned on the mounting table 202 of the apparatus shown in FIG. 2, and it was subjected to repairing treatment in the same manner as described in the case of performing the repairing method using this apparatus, wherein the distance L between the top of the probe 203 and the surface of the ITO transparent and conductive thin film of the photosensor element was maintained constant at 3.0 mm, and the AC voltage-outputting power source 208 was adjusted to apply about 20,000 volt to the probe 203 in a state of not causing discharge (spark). The travelling speed of the probe 203 was made to be 25 mm/sec., whereas the mounting table 202 was moved at a speed of 5.0 mm/sec intermittently every four seconds.

Figure 9B:
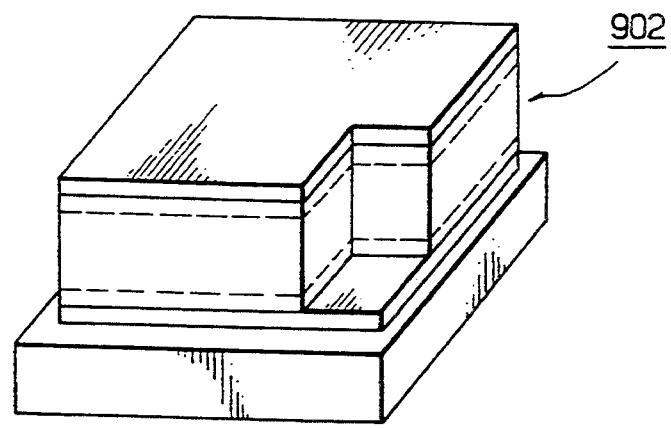

The photosensor element thus treated was subjected to photolithography thereby patterning the pin type amorphous silicon semiconductor layer and the ITO transparent and conductive thin film electrode to be such a configuration as shown by numeral reference 902 in FIG. 9(B).

Figure 9C:
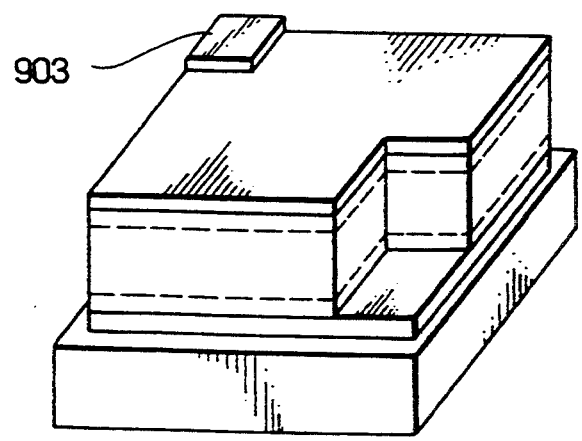
Figure 10A:
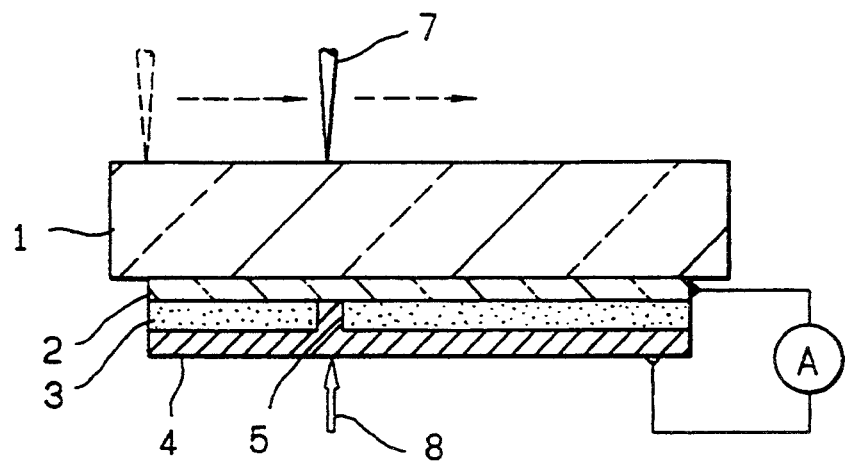
FIGS. 10(A), 10(B), 10(C), 10(D) and 10(E) are schematic views respectively for explaining a conventional method of repairing a defective semiconductor device.
Figure 10B:
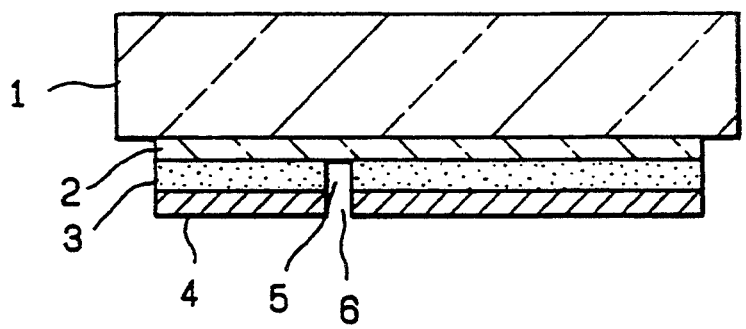
Figure 10C:
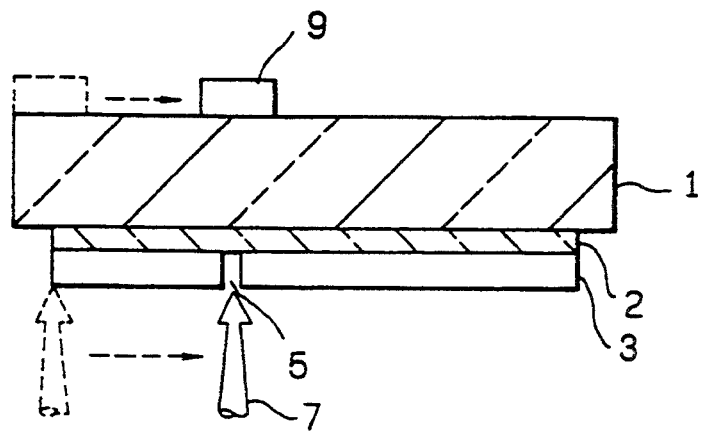
Figure 10D:
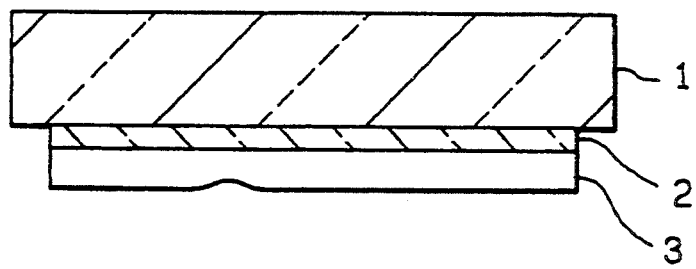
Figure 10E:
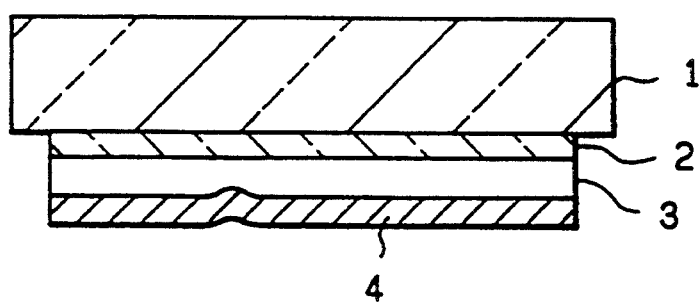

Then, on the ITO transparent and conductive thin film electrode thus patterned was formed an Ag thin film of the configuration shown by numeral reference 903 in FIG. 9(C) as the leading electrode 805 by a vacuum evaporation method. The resultant was cut into thirty six chips. Lead frames 806 were attached to each of the thirty six chips. Thus, there were obtained thirty six diode type photosensors.

As for each of the resultant diode type photosensors, its current/voltage characteristics in a dark state were examined. As a result, thirty five of the thirty six diode type photosensors exhibited a good S/N ratio. As for each of the thirty five diode type photosensors which exhibited a good S/N ratio, spectral-response characteristics were examined. As a result, all of these thirty five diode type photosensors were found to be excellent in the spectral-response characteristics required for a diode type photosensor.

COMPARATIVE EXAMPLE 2

The procedures of Example 2 were repeated, except that the repairing method of the present invention was not performed, to thereby thirty six diode type photosensors.

As for each of the resultant diode type photosensors, its current/voltage characteristics in a dark state were examined. As a result, sixteen of them were found to be short-circuited. Others were found to be practically acceptable in view of S/N ratio.

Further, as for each of the twenty diode type photosensors which were practically acceptable in view of S/N ratio, spectral-response characteristics were examined. As a result, all of these twenty diode type photosensors were found to be practically acceptable in view of spectral-response characteristics.

EXAMPLE 3

In this example, a description is to be made about the case where the repairing method of the present invention is applied in repairing a pin junction amorphous silicon germanium solar cell device having one or more short-circuited portions, using the apparatus shown in FIG. 2.

Firstly, there was provided a glass plate of 100 mm × 100 mm in size and 1.0 mm in thickness. This glass plate was well cleaned in a cleaning vessel. The resultant cleaned glass plate was used as the base member of the pin junction amorphous silicon germanium solar cell device.

On the glass plate as the base member was formed an about 0.3 μm thick Ag conductive thin film by a sputtering method. Then, on the Ag thin film thus formed was formed an about 1.0 μm thick ZnO conductive thin film by a sputtering method. Successively, an about 0.4 μm thick pin junction amorphous silicon germanium semiconductor layer was formed on the previously formed ZnO conductive thin film by a plasma CVD method. Then, on the pin junction amorphous silicon germanium semiconductor layer thus formed was formed an about 0.07 μm thick ITO transparent and conductive thin film by a vacuum evaporation method. In this way, there were prepared a number of pin junction amorphous silicon germanium solar cell elements.

As for each of the resultant pin junction amorphous silicon germanium solar cell elements, its current/voltage characteristics in a dark state were examined by a conventional method. As a result, more than twenty of the pin junction amorphous silicon germanium solar cell elements thus obtained were such that exhibit such characteristics shown in FIG. 6(A). From this result, it was found that these pin junction amorphous silicon germanium solar cell elements do not exhibit diode characteristics and because of this, they have one or more short-circuited portions as shown in FIG. 1.

Thus, twenty of those defective pin junction amorphous silicon solar cell elements were randomly selected. And each of them was positioned on the mounting table 202 of the apparatus shown in FIG. 2, and it was repaired in the same manner as described in the case of performing the repairing method using this apparatus, wherein the distance L between the top of the probe 203 and the surface of the ITO transparent and conductive thin film of the pin junction amorphous silicon germanium solar cell element was maintained constant at 4.5 mm, and the AC voltage-outputting power source 208 was adjusted to apply about 30,000 volt to the probe 203 in a state of not causing discharge (spark). The travelling speed of the probe 203 was made to be 25 mm/sec., whereas the mounting table 202 was moved at a speed of 5.0 mm/sec intermittently every four seconds. The foregoing twenty defective pin junction amorphous silicon germanium solar cell elements were thus repaired. As for each of the resultant twenty pin junction amorphous silicon germanium solar cell elements thus repaired, its current/voltage characteristics in a dark state were examined. As a result, it was found that any of the twenty repaired pin junction amorphous silicon germanium solar cell elements exhibits such desirable diode characteristics as shown in FIG. 6(B). It was also found as for each of the twenty repaired pin junction amorphous silicon germanium solar cell elements that the repaired portions are in such a desirable state as shown in FIG. 3.

On the ITO transparent and conductive thin film of each of the foregoing twenty repaired pin junction amorphous silicon germanium solar cell elements was formed a 1.0 μm thick Ag collecting electrode of the configuration indicated by numeral reference 701 in FIG. 7 by a vacuum evaporation method, to thereby obtain twenty pin junction amorphous silicon germanium solar cell devices.

As for each of the resultants, its current/voltage characteristics in a dark state were examined. As a result, it was found that any of the resultant twenty pin junction amorphous silicon germanium solar cell devices are satisfactory in current/voltage characteristics.

Further, each of the resultant twenty pin junction amorphous silicon germanium solar cell devices was allowed to stand outdoors for two months. And its current/voltage characteristics in a dark state were examined. As a result, nineteen of the twenty solar cell devices were still satisfactory in current/voltage characteristics.

As for each of the twenty pin junction amorphous silicon germanium solar cell devices, it was subjected to measurement of photoelectric conversion efficiency under irradiation of AM 1.5 light.

As a result, it was found that the foregoing nineteen pin junction amorphous silicon germanium solar cell devices provide a satisfactory photoelectric conversion efficiency of more than 10%.

EXAMPLE 4

In this example, description is to be made about the case where the repairing method of the present invention is applied in repairing a large area pin junction amorphous silicon solar cell device having one or more short-circuited portions, using the apparatus shown in FIG. 4.

Firstly, there was provided a lengthy stainless steel web of 50 m in length, 10 cm in width and 0.1 mm in thickness. This stainless steel web was well cleaned in a cleaning vessel. The resultant cleaned stainless steel web was used as the base member of the pin junction amorphous silicon solar cell device.

On the stainless steel web as the base member were formed an about 0.3 μm thick Ag conductive thin film and then, an about 2.0 μm thick conductive thin film respectively by a sputtering method using a conventional roll-to-roll type sputtering apparatus. Successively, an about 0.5 μm thick pin junction amorphous silicon semiconductor layer was formed on the previously formed ZnO conductive thin film by a plasma CVD method using a roll-to-roll type plasma CVD apparatus disclosed in FIG. 2 of U.S. Pat. No. 4,438,724. Then, on the pin junction amorphous silicon semiconductor layer thus formed was formed an about 0.07 μm thick ITO transparent and conductive thin film by a vacuum evaporation method. In this way, there was formed a large area pin junction amorphous silicon solar cell element on the lengthy stainless steel web (hereinafter referred to as pin junction solar cell element web).

The pin junction solar cell element web was set to the apparatus shown in FIG. 4 in the same manner as above described with respect to the repairing method of the present invention using the apparatus shown in FIG. 4, wherein it was treated in the same manner as above described in the case of performing the repairing method using this apparatus wherein the distance L between the top of each of the probes 404 and the surface of the ITO transparent and conductive thin film of the pin junction solar cell element web was maintained constant at 4.0 mm, and each of the AC voltage-outputting power sources 407 was adjusted to apply about 20,000 volt to each of the probes 404 in a state of not causing discharge (spark). The travelling speed of each of the probes 404 was made to be 30 mm/sec. The pin junction solar cell element web thus treated was taken out from the apparatus.

Then, the pin junction solar cell element web was cut by way of a conventional photolithography process to obtain eighty pin junction solar cell elements respectively of 100 mm×100 mm in size.

On the ITO transparent and conductive thin film of each of the eighty pin junction solar cell elements was formed an about 1.0 μm thick Ag collecting electrode of the configuration indicated by numeral reference 701 in FIG. 7 by a vacuum evaporation method, to thereby obtain eighty pin junction amorphous silicon solar cell devices.

As for each of the resultants, its current/voltage characteristics in a dark state were examined. As a result, it was found that any of the resultant twenty pin junction amorphous silicon solar cell devices are satisfactory in current/voltage characteristics.

Further, each of the resultant eighty pin junction amorphous silicon solar cell devices was allowed to stand outdoors for two months. And its current/voltage characteristics in a dark state were examined. As a result, seventy six of the eighty solar cell devices were still satisfactory in current/voltage characteristics.

As for each of the eighty pin junction amorphous silicon solar cell devices, it was subjected to measurement of photoelectric conversion efficiency under irradiation of AM 1.5 light.

As a result, it was found that the foregoing seventy six pin junction amorphous silicon solar cell devices provide a satisfactory photoelectric conversion efficiency of more than 10%.

EXAMPLE 5

As well as in the case of Example 4, description is to be made about the case where the repairing method of the present invention is applied in repairing a large area pin junction amorphous silicon solar cell device having one or more short-circuited portions using the apparatus shown in FIG. 5.

In the same manner as in Example 4, there was provided a large area pin junction amorphous silicon solar cell element formed on a lengthy stainless steel web (hereinafter referred to as pin junction solar cell element web).

The pin junction solar cell element web was set to the apparatus shown in FIG. 5 in the same manner as above described with respect to the repairing method of the present invention using the apparatus shown in FIG. 5. Then, the distance L between the top of each of the probes 508 and the surface of the ITO transparent and conductive thin film of the pin junction solar cell element web 504 was maintained constant at 2.0 mm by the positioning rollers 507. Thereafter, the vacuum vessel 503 was evacuated to bring the inside to a vacuum of less than 10 mTorr. The pin junction solar cell element web 504 was treated in the same manner as above described in the case of performing the repairing method using this apparatus while introducing into the vacuum vessel 503 a gaseous mixture comprising $O_2$ and Ar ($O_2/Ar=10\%$) at a flow rate of 100 sccm wherein the AC voltage-outputting power sources 502 was adjusted to apply about 20,000 volt to each of the probes 508 in a state of not causing discharge (spark) and the travelling speed of the probes 508 was made to be 30 mm/sec. The pin junction solar cell element web thus treated was taken out from the apparatus.

Then, the pin junction solar cell element web was cut by way of a conventional photolithography process to obtain eighty pin junction solar cell elements respectively of 100 mm×100 mm in size.

On the ITO transparent and conductive thin film of each of the eighty pin junction solar cell elements was formed an about 1.0 μm thick Ag collecting electrode of the configuration indicated by numeral reference 701 in FIG. 7 by a vacuum evaporation method, to thereby obtain eighty pin junction amorphous silicon solar cell devices.

As for each of the resultants, its current/voltage characteristics in a dark state were examined. As a result, it was found that any of the resultant twenty pin junction amorphous silicon solar cell devices are satisfactory in current/voltage characteristics.

Further, each of the resultant eighty pin junction amorphous silicon solar cell devices was allowed to stand outdoors for two months. And its current/voltage characteristics in a dark state were examined. As a result, seventy eight of the eighty solar cell devices were still satisfactory in current/voltage characteristics.

As for each of the eighty pin junction amorphous silicon solar cell devices, it was subjected to measurement of photoelectric conversion efficiency under irradiation of AM 1.5 light.

As a result, it was found that the foregoing seventy eight pin junction amorphous silicon solar cell devices provide a satisfactory photoelectric conversion efficiency of more than 10%.

EXAMPLE 6

In this example, description is to be made about the case where the repairing method of the present invention is applied in repairing a pin junction amorphous silicon germanium solar cell device having one or more short-circuited portions, using the apparatus shown in FIG. 2.

Firstly, there was provided a glass plate of 100 mm×100 mm in size and 1.0 mm in thickness. This glass plate was well cleaned in a cleaning vessel. The resultant cleaned glass plate was used as the base member of the pin junction amorphous silicon solar cell device.

On the glass plate as the base member was formed an about 0.07 μm thick ITO transparent and conductive thin film by a vacuum evaporation method. Successively, an about 0.4 μm thick pin junction amorphous silicon germanium semiconductor layer was formed on the previously formed ITO transparent and conductive thin film by a plasma CVD method. Then, on the pin junction amorphous silicon germanium semiconductor layer thus formed was formed an about 0.3 μm thick Ag conductive thin film by a sputtering method. Finally, an about 1.0 μm thick ZnO conductive thin film on the Ag conductive thin film by a sputtering method.

In this way, there were prepared a number of pin junction amorphous silicon germanium solar cell elements.

As for each of the resultant pin junction amorphous silicon germanium solar cell elements, its current/voltage characteristics in a dark state were examined by a conventional method. As a result, more than twenty of the pin junction amorphous silicon germanium solar cell elements thus obtained were such that exhibit such characteristics shown in FIG. 6(A). From this result, it was found that these pin junction amorphous silicon germanium solar cell elements do not exhibit diode characteristics and because of this, they have one or more short-circuited portions as shown in FIG. 1.

Thus, twenty of those defective pin junction amorphous silicon germanium solar cell elements were randomly selected. And each of them was positioned on the mounting table 202 of the apparatus shown in FIG. 2, and it was repaired in the same manner as described in the case of performing the repairing method using this apparatus, wherein the distance L between the top of the probe 203 and the surface of the ZnO conductive thin film of the pin junction amorphous silicon germanium solar cell element was maintained constant at 4.5 mm, and the AC voltage-outputting power source 208 was adjusted to apply about 20,000 volt to the probe 203 in a state of not causing discharge (spark). The travelling speed of the probe 203 was made to be 25 mm/sec., whereas the mounting table 202 was moved at a speed of 5.0 mm/sec. intermittently every four seconds. The foregoing twenty defective pin junction amorphous silicon germanium solar cell elements were thus repaired. As for each of the resultant twenty pin junction amorphous silicon germanium solar cell elements thus repaired, its current/voltage characteristics in a dark state were examined. As a result, it was found that any of the twenty repaired pin junction amorphous silicon germanium solar cell elements exhibits such desirable diode characteristics as shown in FIG. 6(B). It was also found as for each of the twenty repaired pin junction amorphous silicon solar cell elements that the repaired portions are in such a desirable state as shown in FIG. 3.

On the ZnO conductive thin film of each of the twenty repaired pin junction amorphous silicon germanium solar cell elements was formed an about 1.0 μm thick Ag collecting electrode of the configuration indicated by numeral reference 701 in FIG. 7 by a vacuum evaporation method, to thereby obtain twenty pin junction amorphous silicon solar cell devices.

As for each of the resultants, its current/voltage characteristics in a dark state were examined. As a result, it was found that any of the resultant twenty pin junction amorphous silicon germanium solar cell devices are satisfactory in current/voltage characteristics.

Further, each of the resultant twenty pin junction amorphous silicon germanium solar cell devices was allowed to stand outdoors for two months. And its current/voltage characteristics in a dark state were examined. As a result, nineteen of the twenty solar cell devices were still satisfactory in current/voltage characteristics.

As for each of the twenty pin junction amorphous silicon germanium solar cell devices, it was subjected to measurement of photoelectric conversion efficiency under irradiation of AM 1.5 light.

As a result, it was found that the foregoing nineteen pin junction amorphous silicon solar cell devices provide a satisfactory photoelectric conversion efficiency of more than 10%.

COMPARATIVE EXAMPLE 3

In this comparative example, a description is to be made about the case where the known repairing method is applied in repairing a pin junction amorphous silicon germanium solar cell device of the same configuration as that of the pin junction amorphous silicon germanium solar cell device in Example 6 which has one or more short-circuited portions.

Figure 11:
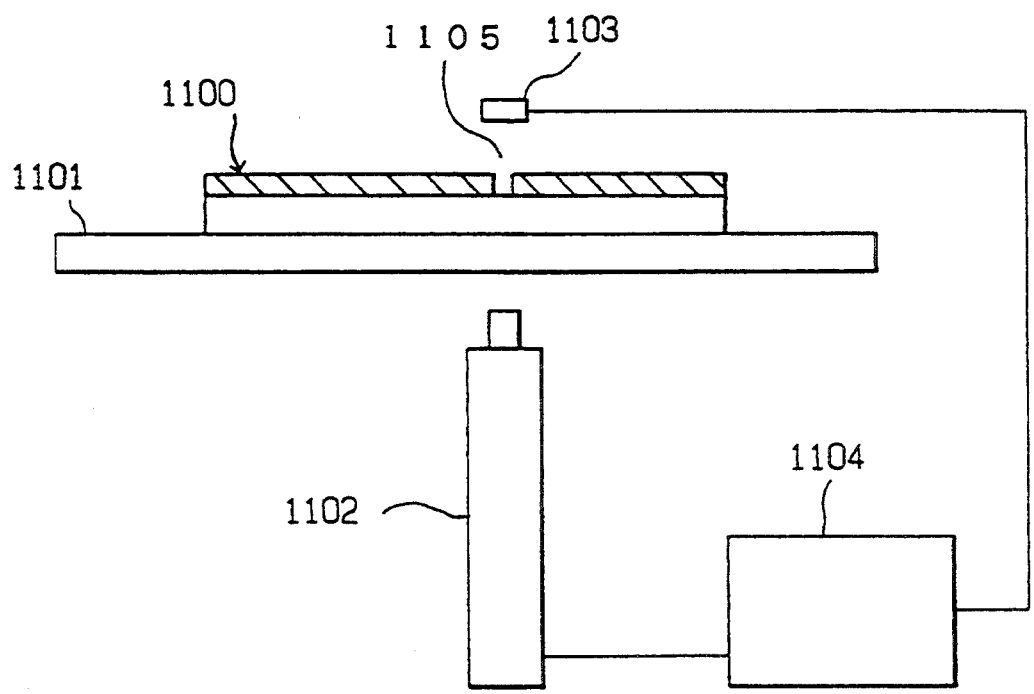
FIGS. 11 and 12 are schematic views for explaining other conventional methods of repairing a defective semiconductor device.

Shown in FIG. 11 is a schematic diagram of the known repairing method.

In FIG. 11, numeral reference 1100 stands for a glass plate, numeral reference 1002 stands for an argon gas laser of 514.5 nm in oscillating wavelength, and numeral reference 1103 stands for a photosensor having a sensitivity to said wavelength and which outputs a signal. Numeral reference 1104 stands for a controller which serves to control an outputting power of the argon gas laser depending upon a signal outputted from the photosensor 1103.

There was provided a pin junction amorphous silicon germanium solar cell element 1100 prepared in the same manner as in Example 6. (This pin junction amorphous silicon germanium solar cell element has one or more pinholes.)

A glass plate 1101 of 1.0 mm in thickness was placed at the position above the argon gas laser 1102 such that laser beam from the argon gas laser is irradiated to the rear face of the glass plate. The photosensor 1103 was arranged so as to be situated over the optical path of the laser beam from the argon gas laser 1102. Then, the pin junction amorphous silicon germanium solar cell element 1100 (hereinafter referred to as pin junction solar cell element 1100, in short) was positioned on the glass plate 1101 in the way as shown in FIG. 11. (The glass plate 1101 is designed such that it can horizontally move either to side by means of a manipulator (not shown in the figure) to allow the laser beam from the argon gas laser 1102 to be irradiated to an optional position of the pin junction amorphous silicon germanium semiconductor layer of the pin junction solar cell element 1100.)

Numeral reference 1105 stands for a pinhole occurring at the pin junction amorphous silicon germanium semiconductor layer which was previously detected by a scanning electron microscope. (FIG. 12 is a schematic explanatory view of this pinhole, wherein numeral reference 1202 stands for a transparent and conductive substrate having a pin junction amorphous silicon germanium semiconductor layer with a pinhole 1200 being disposed thereon.)

Then, the argon gas laser 1102 was actuated to oscillate the laser beam, wherein the glass plate was moved to allow the laser beam to be irradiated through the pinhole 1105 to the photosensor 1103; and the controller 1104 was adjusted to reduce the outputting power of the argon gas laser 1102 to a detection limit of the photosensor 1103.

Figure 12:
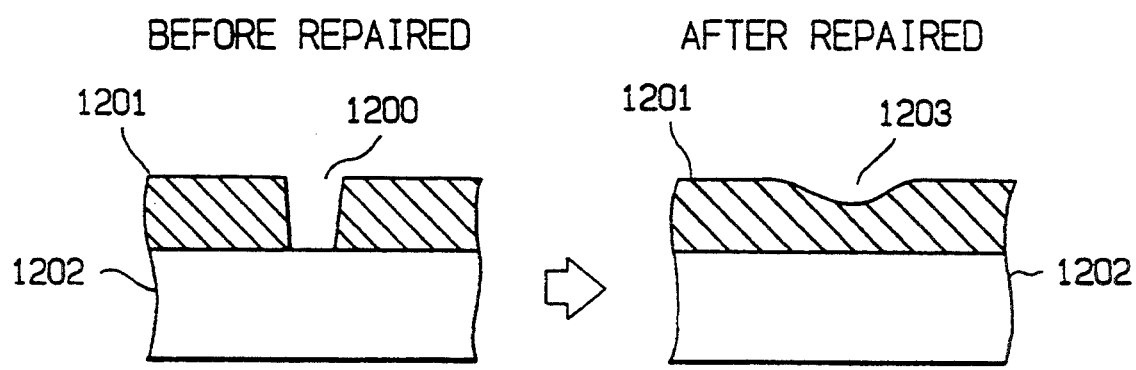

Successively, the outputting power of the argon gas laser 1102 was raised by adjusting the controller 1104 to fuse the periphery of the pinhole 1105, whereby the pinhole 1105 was filled up with the constituent of the pin junction amorphous silicon germanium semiconductor layer in a state shown by numeral reference 1203 in FIG. 12.

Independently, with respect to this known repairing method, observation was made about whether it is possible to perform detection and repairs of a pinhole of the pin junction amorphous silicon germanium semiconductor layer at the same time as in the present invention.

That is, the above known repairing system was modified such that the entire surface region of the pin junction solar cell element 1100 can be scanned by a manipulator (not shown in the figure) while horizontally moving the glass plate 1101 at a speed of 1.0 mm/sec in order for pinholes of the pin junction amorphous silicon germanium semiconductor layer to be detected by the photosensor 1103; and the controller 1104 is programed such that the manipulator is terminated and the outputting power of the argon gas laser 1102 is raised when such pinholes could be detected by the photosensor 1103. Using this modified system, detection and repairs of one or more pinholes of a pin amorphous silicon germanium solar cell element were tried to be performed at the same time as in the case of the present invention. As a result, it was found that it is almost impossible to perform detection and repairs of a pinhole of the pin junction amorphous silicon germanium semiconductor layer at the same time, because the foregoing laser beam passes through the pinhole but is substantially absorbed by the pin junction amorphous silicon germanium semiconductor layer with no such pinhole.

Now, on the pin junction solar cell element repaired in the above in accordance with the known repairing method, an about 1.0 μm thick ZnO conductive thin film was formed by a sputtering method. Successively, on the ZnO conductive thin film was formed an about 0.3 μm thick Ag thin film by a sputtering method. In this way, there were prepared twenty pin junction amorphous silicon germanium solar cell devices.

As for each of the resultants, its current/voltage characteristics in a dark state were examined. As a result, it was found that only twelve of the resultant twenty pin junction amorphous silicon germanium solar cell devices are practically acceptable in view of current/voltage characteristics.

Further, each of the foregoing twelve pin junction amorphous silicon germanium solar cell devices (which were practically acceptable in view of current/voltage characteristics) was allowed to stand outdoors for two months. And its current/voltage characteristics in a dark state were examined. As a result, only six of the twelve solar cell devices were still practically acceptable in view of current/voltage characteristics.

As for each of the foregoing six pin junction amorphous silicon germanium solar cell devices, it was subjected to measurement of photoelectric conversion efficiency under irradiation of AM 1.5 light.

As a result, it was found that the foregoing six pin junction amorphous silicon solar cell devices provide a photoelectric conversion efficiency of less than 9%.

As apparent from what is above described, the present invention provides various significant advantages which can not be easily expected by the prior art. That is, (i) a plurality of pineholes present in a large semiconductor device can be entirely repaired by a simple process without hindering the quality of the semiconductor device and because of this, the yield of a semiconductor device is markedly improved; (ii) since detection and repairs of such pinholes are performed at the same time, it is not necessary to perform detection of the spatial location of such pinholes prior to commencing the repairing process as in the prior art; (iii) the entire process of repairing such pinholes is performed under dry environment without such a time-consuming complicated process including a water-treating step and a drying step as in the prior art and because of this, the period of time required for the production of a semiconductor device is markedly shortened; (iv) a desirable semiconductor device can be efficiently produced without the problems of reducing the quality thereof with corrosion by water, alkaline materials, etc.; and (v) the cost of a semiconductor device can be eventually reduced.

What is claimed is:

1. An apparatus for repairing a defective semiconductor device having an electrically short-circuited portion, the semiconductor device comprising a semiconductor thin film and a conductive thin film being disposed in the named order on a conductive surface of a substrate, in which the conductive thin film and the conductive surface of the substrate are electrically short-circuited at a pinhole occurring in the semiconductor thin film to form an electrically short-circuited portion such that the semiconductor device is defective, said apparatus comprising:

substrate holding means for holding the substrate of the defective semiconductor device;

an electrode being arranged above said substrate holding means so that, when the defective semiconductor device is positioned on said substrate holding means, there is a predetermined distance between said electrode and the conductive thin film of the defective semiconductor device, said electrode being capable of moving in relation to the substrate of the defective semiconductor device; and a voltage applying means for applying a desired voltage to said electrode, wherein discharge is caused between said electrode and the conductive thin film of the defective semiconductor device by applying a desired voltage to said electrode through said voltage applying means to thereby modify a region of the conductive thin film of the defective semiconductor device in electrical contact with the conductive surface of the substrate of the defective semiconductor device.

2. An apparatus according to claim 1, wherein said electrode comprises a sharply pointed tip.

3. An apparatus according to claim 1, wherein said electrode comprises a material selected from the group consisting of copper, gold, silver, iron, nickel, and stainless steel.

* * * * *

UNITED STATES PATENT AND TRADEMARK OFFICE
CERTIFICATE OF CORRECTION

PATENT NO. : 5,418,680
DATED : May 23, 1995
INVENTOR(S) : KEISHI SAITO, ET AL.

It is certified that error appears in the above-identified patent and that said Letters Patent is hereby corrected as shown below:

COLUMN 1

Line 15, "pin holes" should read --pinholes--.
Line 23, "addition" should read --addition,--.
Line 32, "film" should read --film,--.
Line 55, "angstrom" should read --angstroms--.

COLUMN 2

Line 16, "dust." should read --dust particles.--.

COLUMN 3

Line 33, "Outputting" should read --outputting--.
Line 43, "semiconductor 3" should read --semiconductor layer 3--.
Line 67, "10000" should read --10000 Å--.

COLUMN 4

Line 14, "other" should read --another--.
Line 32, "shown" should read --is shown--.

COLUMN 5

Line 30, "under described." should read --described below.--.

COLUMN 6

Line 2, "prove" should read --probe--.
Line 52, "perpendicular" should read --perpendicular,--.

UNITED STATES PATENT AND TRADEMARK OFFICE
CERTIFICATE OF CORRECTION

PATENT NO. : 5,418,680
DATED : May 23, 1995
INVENTOR(S) : KEISHI SAITO, ET AL.

It is certified that error appears in the above-identified patent and that said Letters Patent is hereby corrected as shown below:

COLUMN 7

Line 68, "of a" should be deleted.

COLUMN 8

Line 36, "curred" should read --curring--.

COLUMN 9

Line 10, "rials" should read --rials,--.
Line 56, "dusts" should read --dust particles--.

COLUMN 10

Line 6, "dusts." should read --dust particles.--.
Line 66, "of the" should be deleted.

COLUMN 11

Line 68, "millimeter" should read --millimeters--.

COLUMN 12

Line 16, "portion" should read --portions--.

COLUMN 13

Line 16, "millimeter" should read --millimeters--.

UNITED STATES PATENT AND TRADEMARK OFFICE
CERTIFICATE OF CORRECTION

PATENT NO. : 5,418,680

DATED : May 23, 1995

INVENTOR(S) : KEISHI SAITO, ET AL.

It is certified that error appears in the above-identified patent and that said Letters Patent is hereby corrected as shown below:

COLUMN 14

Line 8, "regards on" should read --regards to--.
Line 27, "of" should be deleted.
Line 28, "the" should be deleted.
Line 52, "continuous" should read --continuous,--.
Line 62, "Of" should read --of--.

COLUMN 15

Line 19, "angle $\theta$" should read --angle $\theta$--.
Line 55, "of the" should be deleted.

COLUMN 16

Line 63, "occurred" should read -occurring--.
Line 67, "of the" should be deleted.

COLUMN 19

Line 55, "1.33 holds." should read --1.33 holes.--.

COLUMN 20

Line 10, "1.0" should read --1.0 mm--.

COLUMN 21

Line 1, "thereby" should read --thereby obtain--.

COLUMN 25

Line 4, "film" should read --film was formed--.

UNITED STATES PATENT AND TRADEMARK OFFICE
CERTIFICATE OF CORRECTION

PATENT NO. : 5,418,680

DATED : May 23, 1995

INVENTOR(S) : KEISHI SAITO, ET AL.

It is certified that error appears in the above-identified patent and that said Letters Patent is hereby corrected as shown below:

COLUMN 26

Line 43, "either to" should read --to either--.

COLUMN 27

Line 16, "programed" should read --programmed--.

COLUMN 28

Line 2, "pineholes" should read --pinholes--.

Signed and Sealed this

Fifth Day of March, 1996

Attest:

BRUCE LEHMAN

Attesting Officer

Commissioner of Patents and Trademarks